(12) United States Patent
Huang

(10) Patent No.: US 11,217,971 B2
(45) Date of Patent: Jan. 4, 2022

(54) AC POWER ADAPTER AND POWER DISTRIBUTION SYSTEM EMPLOYING SAME

(71) Applicant: Delta Electronics, Inc., Taoyuan (TW)

(72) Inventor: Yu-Hung Huang, Taoyuan (TW)

(73) Assignee: DELTA ELECTRONICS, INC., Taoyuan (TW)

(*) Notice: Subject to any disclaimer, the term of this patent is extended or adjusted under 35 U.S.C. 154(b) by 0 days.

(21) Appl. No.: 16/941,915

(22) Filed: Jul. 29, 2020

(65) Prior Publication Data
US 2020/0358265 A1 Nov. 12, 2020

Related U.S. Application Data

(62) Division of application No. 15/861,563, filed on Jan. 3, 2018, now Pat. No. 10,770,869.
(Continued)

(30) Foreign Application Priority Data

Nov. 29, 2017 (CN) .......................... 201711229424.5

(51) Int. Cl.
*H02B 1/20* (2006.01)
*G06F 1/18* (2006.01)
(Continued)

(52) U.S. Cl.
CPC ............... *H02B 1/20* (2013.01); *G06F 1/189* (2013.01); *H01R 9/24* (2013.01); *H01R 33/94* (2013.01);
(Continued)

(58) Field of Classification Search
CPC ........... G06F 1/189; G06F 1/263; H02B 1/20; H02B 1/56; H02B 1/48; H02G 5/025; H02J 3/06; H01R 9/24; H01R 33/94; H01R 31/06; H01R 13/02; H01R 13/502; H05K 7/1492
(Continued)

(56) References Cited

U.S. PATENT DOCUMENTS 2,028,509 A 1/1936 Knell
2,611,500 A 9/1952 Martin
(Continued)

*Primary Examiner* — Anatoly Vortman
(74) *Attorney, Agent, or Firm* — Kirton McConkie; Evan R. Witt

(57) ABSTRACT

The present disclosure provides an AC power adapter comprising plural connectors, plural first power conveying wires, a junction box, a power conveying wire assembly and a plug. The first power conveying wire is connected with the connector and comprises an input neutral wire, an input live wire and an input ground wire. The first power conveying wire is inserted into the junction box. The power conveying wire assembly is inserted into the junction box and comprises plural output neutral wires, plural output live wires and an output ground wire. The output neutral wires are connected with the input neutral wires one-to-one, the output live wires are connected with the input live wires one-to-one, and the output ground wire is connected with the input ground wires. The plug comprises a housing and an electrical connector. The power conveying wire assembly is inserted into the housing and connected with the electrical connector.

12 Claims, 34 Drawing Sheets

Related U.S. Application Data

(60) Provisional application No. 62/553,188, filed on Sep. 1, 2017.

(51) Int. Cl.
*H02B 1/56* (2006.01)
*H02G 5/02* (2006.01)
*H02B 1/48* (2006.01)
*H05K 7/14* (2006.01)
*H01R 9/24* (2006.01)
*H01R 33/94* (2006.01)
*H02J 3/06* (2006.01)

(52) U.S. Cl.
CPC ............... *H02B 1/48* (2013.01); *H02B 1/56* (2013.01); *H02G 5/025* (2013.01); *H02J 3/06* (2013.01); *H05K 7/1492* (2013.01)

(58) Field of Classification Search
USPC .......................................................... 361/641
See application file for complete search history.

(56) References Cited

U.S. PATENT DOCUMENTS

| | | | |
|---|---|---|---|
| 4,892,485 A * | 1/1990 | Patton | H01R 29/00 29/846 |
| 5,302,857 A * | 4/1994 | Charles | H02M 7/10 307/20 |
| 6,566,600 B1 | 5/2003 | Ford et al. | |
| 7,001,222 B2 * | 2/2006 | Mazzullo | H01R 13/4534 439/695 |
| 8,994,213 B1 | 3/2015 | Czamara et al. | |
| 9,320,166 B1 | 4/2016 | Marr et al. | |
| 9,622,373 B1 | 4/2017 | Sarti | |
| 9,727,100 B1 | 8/2017 | Eaton | |
| 2003/0056970 A1 * | 3/2003 | Young | H02G 3/00 174/72 A |
| 2006/0054334 A1 * | 3/2006 | Vaupotic | H01B 11/1008 174/36 |
| 2008/0057780 A1 | 3/2008 | O'Rourke | |
| 2008/0093927 A1 * | 4/2008 | Ewing | H05K 7/1492 307/23 |
| 2009/0242265 A1 * | 10/2009 | Doorhy | H05K 7/1457 174/494 |
| 2009/0249960 A1 * | 10/2009 | Lassota | A47J 31/58 99/288 |
| 2011/0136353 A1 | 6/2011 | Spitaels et al. | |
| 2012/0305307 A1 | 12/2012 | Korcz et al. | |
| 2013/0182416 A1 * | 7/2013 | Wilson | F21V 23/06 362/147 |
| 2015/0177797 A1 * | 6/2015 | Butzer | G06F 1/189 713/300 |
| 2017/0311399 A1 * | 10/2017 | Shah | F21V 23/009 |

\* cited by examiner

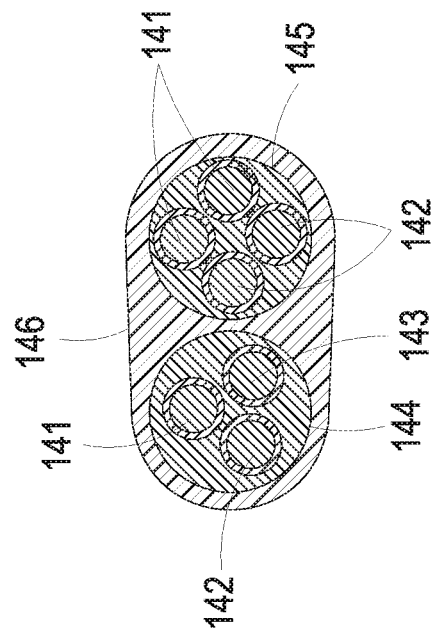
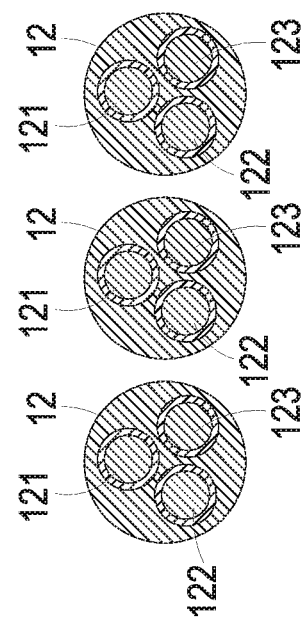
FIG. 4A
FIG. 4B

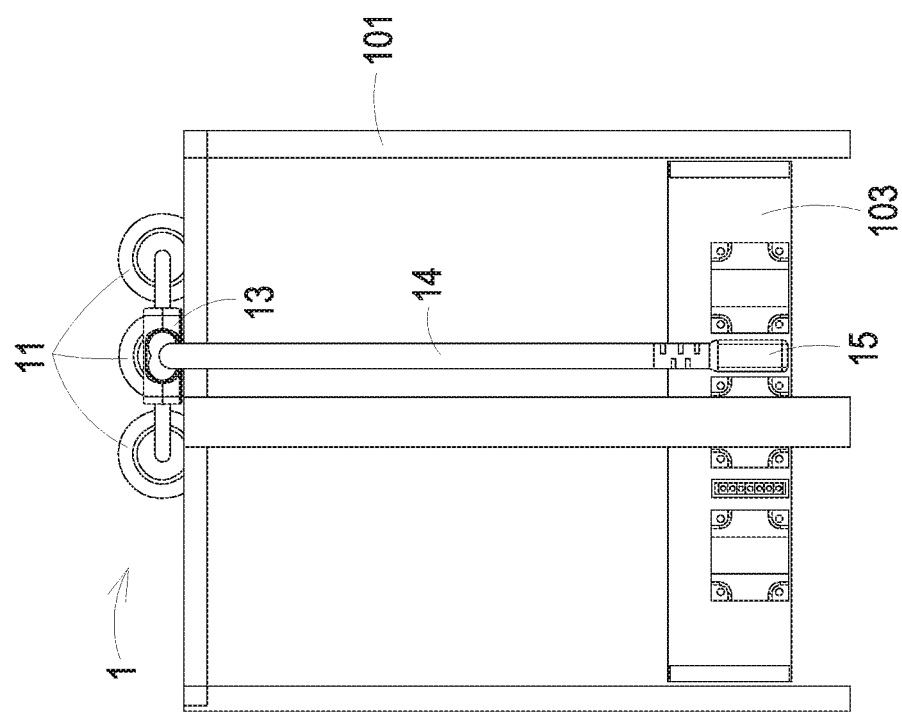

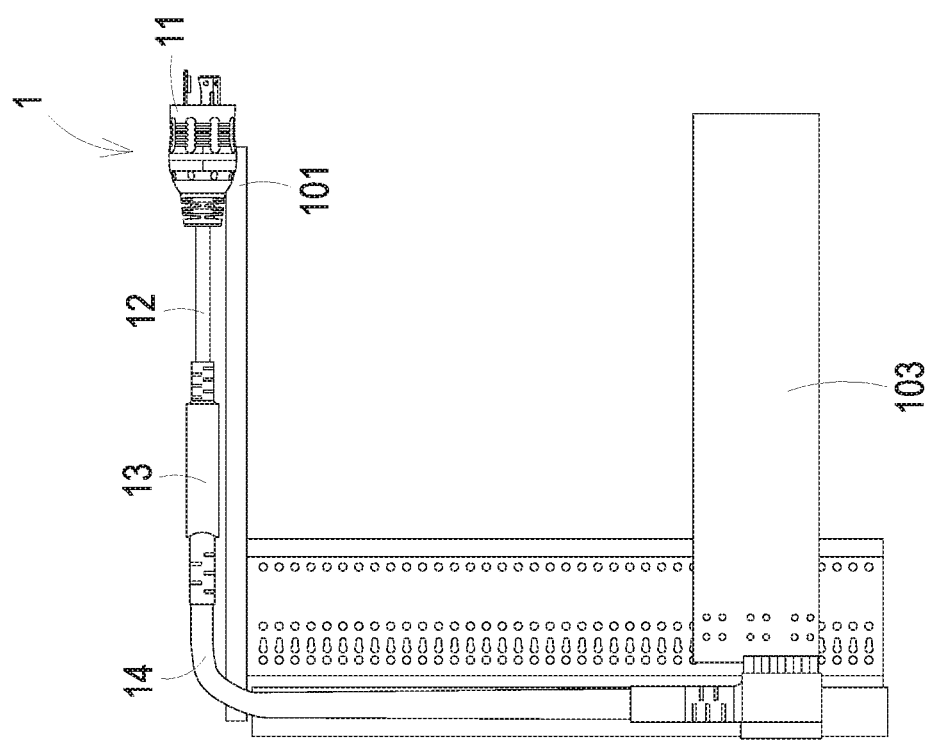

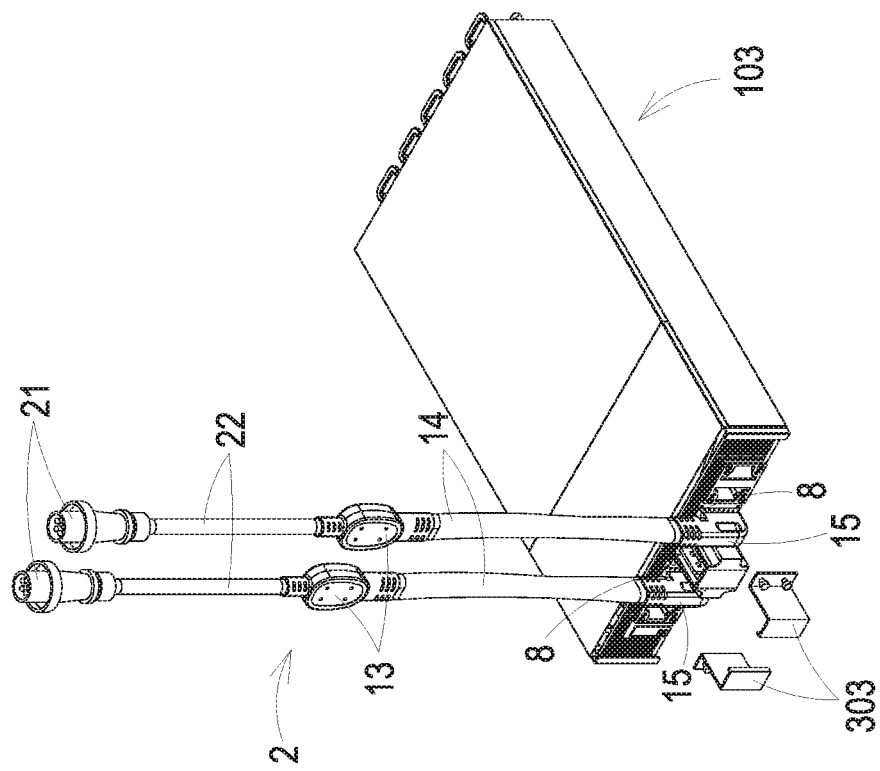

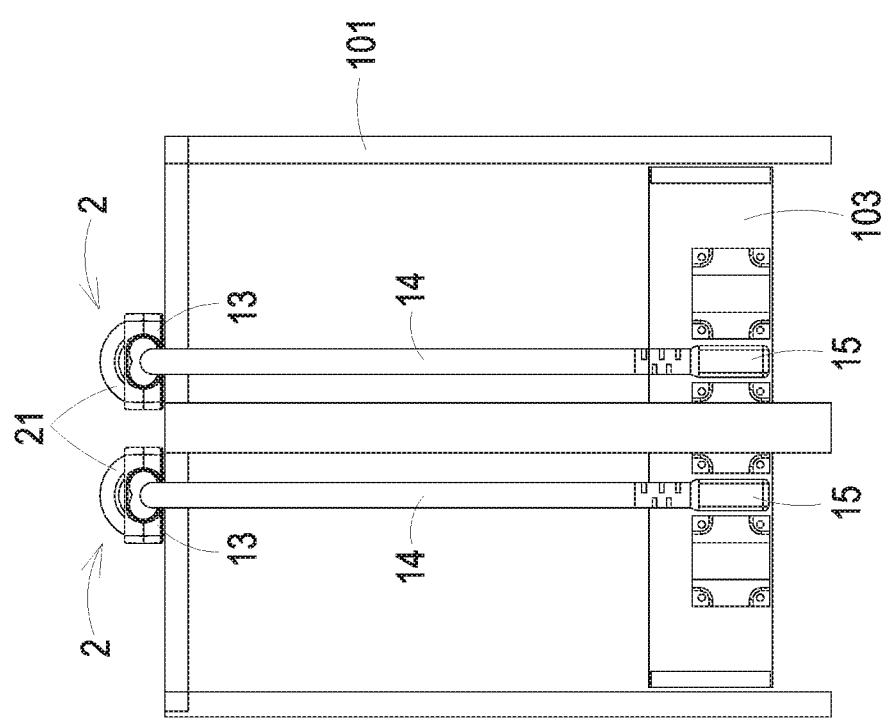

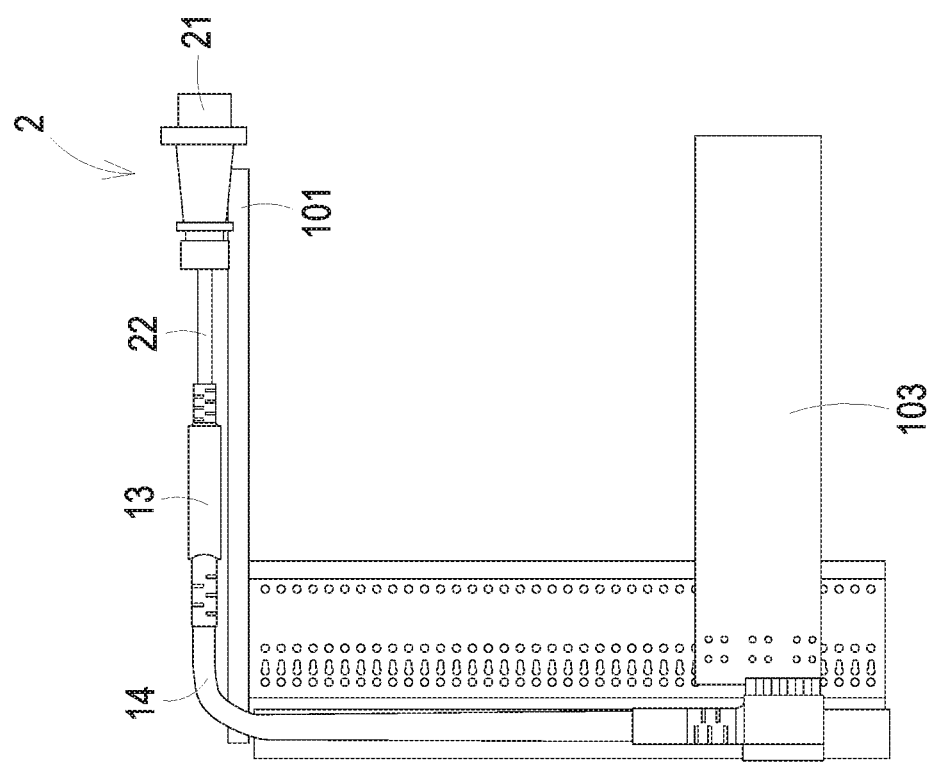

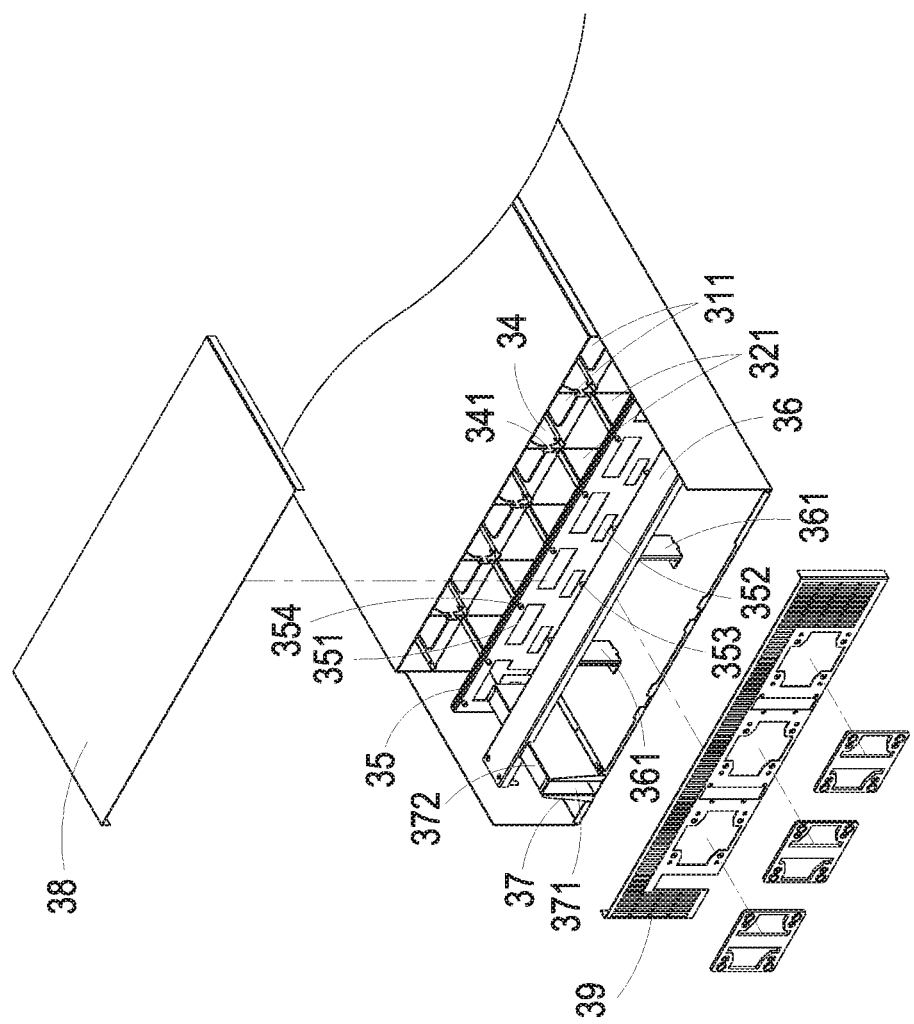

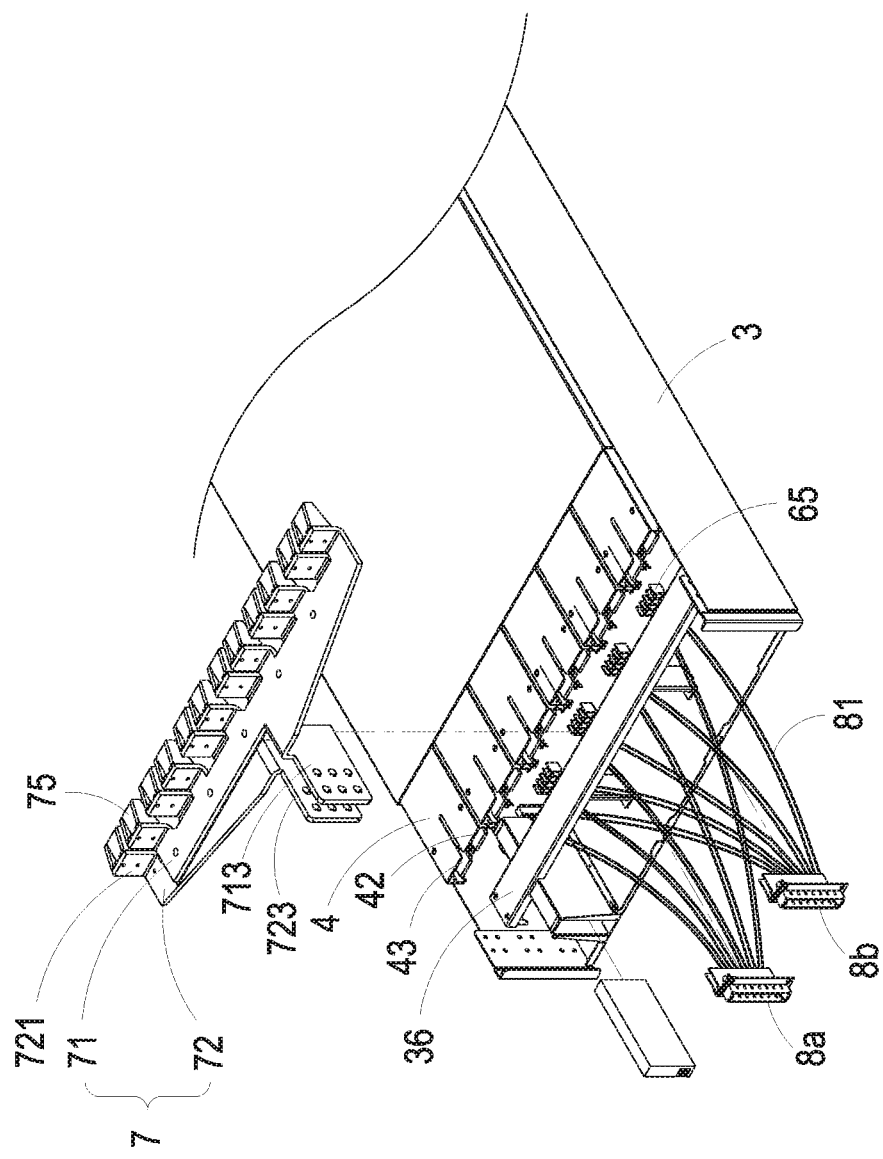

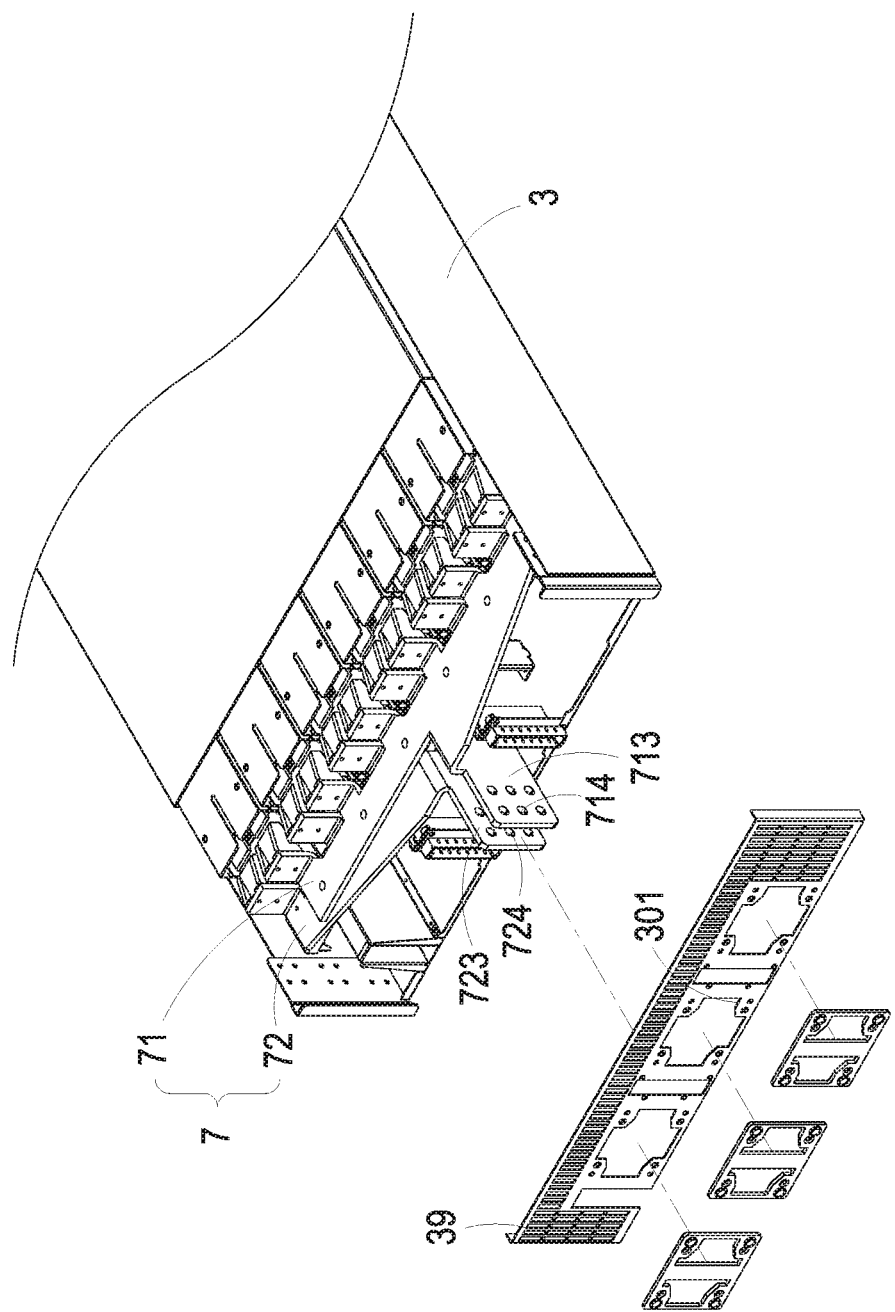

AC POWER ADAPTER AND POWER DISTRIBUTION SYSTEM EMPLOYING SAME

CROSS-REFERENCE TO RELATED APPLICATION

This application is a divisional application of U.S. application Ser. No. 15/861,563 filed on Jan. 3, 2018 and entitled "AC POWER ADAPTER AND POWER DISTRIBUTION SYSTEM EMPLOYING SAME", which claims the benefit of U.S. Provisional Application No. 62/553,188 filed on Sep. 1, 2017 and claims priority to China Patent Application No. 201711229424.5 filed on Nov. 29, 2017. The entire contents of the above-mentioned patent applications are incorporated herein by reference for all purposes.

FIELD OF THE INVENTION

The present disclosure relates to an AC power adapter and a power distribution system employing the same, and more particularly to an AC power adapter receiving and adapting a three-phase AC power or three single-phase AC powers to three single-phase AC powers sharing ground wire and the power distribution system employing the same.

BACKGROUND OF THE INVENTION

With increasing development of information industries and networks, the services provided through networks are becoming more and more popular in various applications. Nowadays, data center has been widely applied to cloud computing and large-scale data and application services in information technology (IT) operations. Generally, a power distribution shelf is used to distribute electric power among the computers or servers of the data center. For designing the power distribution shelf, the kind of utility power provided to the power distribution shelf and the location of the power distribution shelf should be determined in advance. Accordingly, an exclusive power distribution shelf is assembled. Therefore, the power distribution shelf cannot be used in another data center with different specifications.

Due to globalization, international corporations usually build many data centers in different countries or regions in order to increase the efficiency of the data centers. As known, the utility power specifications (e.g. 120/400 volt, 3-phase, 4-wire or 220 volt, single-phase, 2-wire) for different countries or regions may be distinguished. For complying with the utility power specifications, the data centers in different countries or regions have respective exclusive power distribution shelves. In case a power distribution shelf has a breakdown, the maintenance worker may replace the power distribution shelf with a new one that complies with the desired utility power specification. Therefore, the cost and difficulty associated with maintenance are increased.

For increasing the overall operating efficiency of the data center, the location of the data center may be changed. Since the utility power specification is changed accordingly, the original power distribution shelf of the data center cannot be used. It is necessary to purchase or design a new power distribution shelf to comply with the new utility power specification, which increases the cost and wastes resource.

For solving the above drawbacks, the manufactures usually produce many kinds of power distribution shelves in order to comply with different utility power specifications. Since different power distribution shelves have different component specification, the complexity of assembling the power distribution shelves and the fabricating cost are both increased.

Therefore, there is a need of providing an AC power adapter and a power distribution system employing the same to obviate the drawbacks encountered from the prior arts.

SUMMARY OF THE INVENTION

It is an object of the present disclosure to provide an AC power adapter and a power distribution system employing the same. The AC power adapter receives and adapts a three-phase AC power or three single-phase AC powers to three single-phase AC powers sharing ground wire. Therefore, the three single-phase AC powers sharing ground wire are provided by an electrical connector of a plug of the AC power adapter. Consequently, the power distribution shelf, which is connected with the AC power adapter, is selectively powered by the three-phase AC power or the single-phase AC power according to the practical requirements. Thus the applicability of the AC power adapter is enhanced. In addition, it is unnecessary to design a corresponding connector for the power distribution shelf in accordance with different input power, which decreases the fabricating cost and maintenance cost.

It is an object of the present disclosure to provide an AC power adapter and a power distribution system employing the same. By the AC power adapter of the power distribution system, a multiple input power distribution shelf of the power distribution system selectively receives the single-phase AC power or the three-phase AC power according to the practical requirements. It is unnecessary to design a corresponding AC input power connector in accordance with different input power, which decreases the fabricating cost and maintenance cost.

In accordance with an aspect of the present disclosure, there is provided an AC power adapter. The AC power adapter comprises plural connectors, plural first power conveying wires, a junction box, a power conveying wire assembly and a plug. Each of the plural connectors is configured to receive a single-phase AC power. The plural first power conveying wires are connected with the plural connectors one-to-one. Each of the plural first power conveying wires comprises an input neutral wire, an input live wire and an input ground wire. The input neutral wire, the input live wire and the input ground wire are insulated from each other. The junction box comprises a first accommodation space. Each of the plural first power conveying wires is at least partially inserted into the first accommodation space. The power conveying wire assembly is at least partially inserted into the first accommodation space and comprises plural output neutral wires, plural output live wires and an output ground wire. The plural output neutral wires, the plural output live wires and the output ground wire are insulated from each other. In the first accommodation space, the plural output neutral wires are connected with the plural input neutral wires of the plural first power conveying wires one-to-one, the plural output live wires are connected with the plural input live wires of the plural first power conveying wires one-to-one, and the output ground wire is connected with the plural input ground wires of the plural first power conveying wires. The plug comprises a housing and an electrical connector. The electrical connector is engaged or embedded in the housing. The power conveying wire assembly is at least partially inserted into the housing and is electrically connected with the electrical connector.

In accordance with another aspect of the present disclosure, there is provided an AC power adapter. The AC power adapter comprises a connector, a first power conveying wire, a junction box, a power conveying wire assembly and a plug. The connector is configured to receive a three-phase AC power. The first power conveying wire is connected with the connector and comprises an input neutral wire, plural input live wires and an input ground wire. The input neutral wire, the plural input live wires and the input ground wire are insulated from each other. The junction box comprises a first accommodation space. The first power conveying wire is at least partially inserted into the first accommodation space. The power conveying wire assembly is at least partially inserted into the first accommodation space and comprises plural output neutral wires, plural output live wires and an output ground wire. The plural output neutral wires, the plural output live wires and the output ground wire are insulated from each other. In the first accommodation space, the plural output neutral wires are all connected with the input neutral wire of the first power conveying wire, the plural output live wires are connected with the plural input live wires of the first power conveying wire one-to-one, and the output ground wire is connected with the input ground wire of the first power conveying wire. The plug comprises a housing and an electrical connector. The electrical connector is engaged or embedded in the housing, and the power conveying wire assembly is at least partially inserted into the housing and is electrically connected with the electrical connector.

In accordance with another aspect of the present disclosure, there is provided a power distribution system. The power distribution system comprises at least one AC power adapter and a multiple input power distribution shelf. Each AC power adapter comprises plural connectors, plural first power conveying wires, a junction box, a power conveying wire assembly and a plug. Each of the plural connectors is configured to receive a single-phase AC power. The plural first power conveying wires are connected with the plural connectors one-to-one. Each of the plural first power conveying wires comprises an input neutral wire, an input live wire and an input ground wire. The input neutral wire, the input live wire and the input ground wire are insulated from each other. The junction box comprises a first accommodation space. Each of the plural first power conveying wires is at least partially inserted into the first accommodation space. The power conveying wire assembly is at least partially inserted into the first accommodation space and comprises plural output neutral wires, plural output live wires and an output ground wire. The plural output neutral wires, the plural output live wires and the output ground wire are insulated from each other. In the first accommodation space, the plural output neutral wires are connected with the plural input neutral wires of the plural first power conveying wires one-to-one, the plural output live wires are connected with the plural input live wires of the plural first power conveying wires one-to-one, and the output ground wire is connected with the plural input ground wires of the plural first power conveying wires. The plug comprises a housing and an electrical connector. The electrical connector is engaged or embedded in the housing. The power conveying wire assembly is at least partially inserted into the housing and is electrically connected with the electrical connector. The multiple input power distribution shelf is electrically connected with the AC power adapter and is mounted on a server rack. The multiple input power distribution shelf comprises plural AC input power connectors. The plural AC input power connectors are configured to electrically connect with the plug of the AC power adapter and receive an AC input power.

In accordance with another aspect of the present disclosure, there is provided a power distribution system. The power distribution system comprises at least one AC power adapter and a multiple input power distribution shelf. Each AC power adapter comprises a connector, a first power conveying wire, a junction box, a power conveying wire assembly and a plug. The connector is configured to receive a three-phase AC power. The first power conveying wire is connected with the connector and comprises an input neutral wire, plural input live wires and an input ground wire. The input neutral wire, the plural input live wires and the input ground wire are insulated from each other. The junction box comprises a first accommodation space. The first power conveying wire is at least partially inserted into the first accommodation space. The power conveying wire assembly is at least partially inserted into the first accommodation space and comprises plural output neutral wires, plural output live wires and an output ground wire. The plural output neutral wires, the plural output live wires and the output ground wire are insulated from each other. In the first accommodation space, the plural output neutral wires are all connected with the input neutral wire of the first power conveying wire, the plural output live wires are connected with the plural input live wires of the first power conveying wire one-to-one, and the output ground wire is connected with the input ground wire of the first power conveying wire. The plug comprises a housing and an electrical connector. The electrical connector is engaged or embedded in the housing, and the power conveying wire assembly is at least partially inserted into the housing and is electrically connected with the electrical connector. The multiple input power distribution shelf is electrically connected with the AC power adapter and is mounted on a server rack. The multiple input power distribution shelf comprises plural AC input power connectors. The plural AC input power connectors are configured to electrically connect with the plug of the AC power adapter and receive an AC input power.

The above contents of the present disclosure will become more readily apparent to those ordinarily skilled in the art after reviewing the following detailed description and accompanying drawings, in which:

BRIEF DESCRIPTION OF THE DRAWINGS

FIG. 4A is a cross-sectional view showing the first power conveying wire of FIG. 1 along the section AA;

FIG. 4B is a cross-sectional view showing the power conveying wire assembly of FIG. 1 along the section BB;

FIG. 9B is a schematic view showing the power distribution system of FIG. 9A disposed on a server rack;

FIG. 9C is a side view showing the power distribution system and the server rack of FIG. 9B;

FIG. 10A is a schematic perspective view illustrating a power distribution system according to another embodiment of the present disclosure;

FIG. 10B is a schematic view showing the power distribution system of FIG. 10A disposed on a server rack;

FIG. 10C is a side view showing the power distribution system and the server rack of FIG. 10B;

FIG. 14B is an explored view showing a rear portion of the chassis of FIG. 14A;

FIG. 17C is a schematic view showing the bus bar assembly fastened within the chassis;

FIG. 19A is a schematic perspective view illustrating the relationships between the output parts of the bus bar assembly and the rear plate of the chassis;

DETAILED DESCRIPTION OF THE PREFERRED EMBODIMENT

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Figure 1:
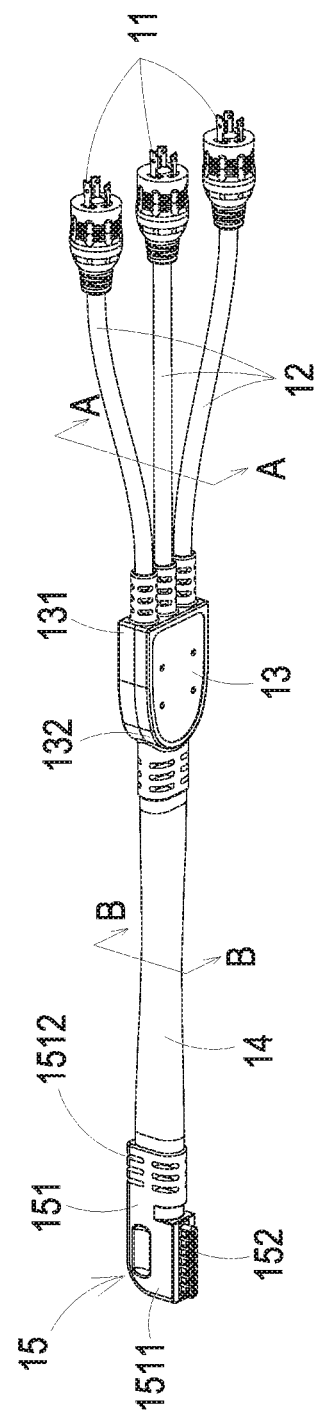
FIG. 1 is a schematic perspective view illustrating an AC power adapter according to an embodiment of the present disclosure.
Figure 2:
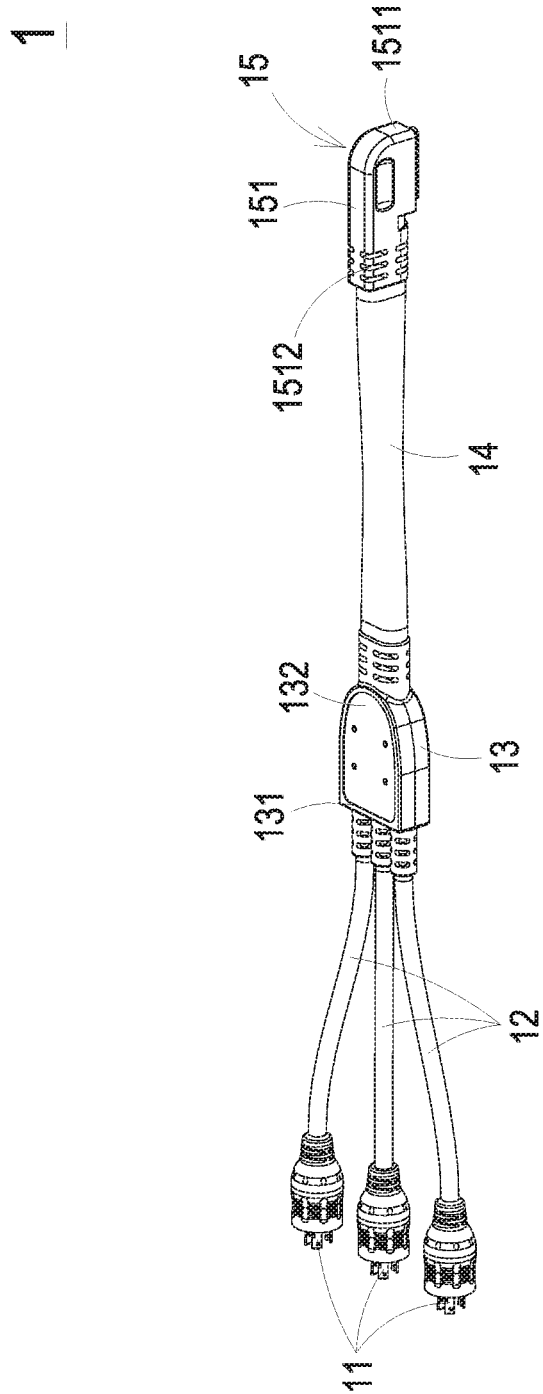
FIG. 2 is a schematic perspective view illustrating the AC power adapter of FIG. 1 at another viewing angle.
Figure 3:
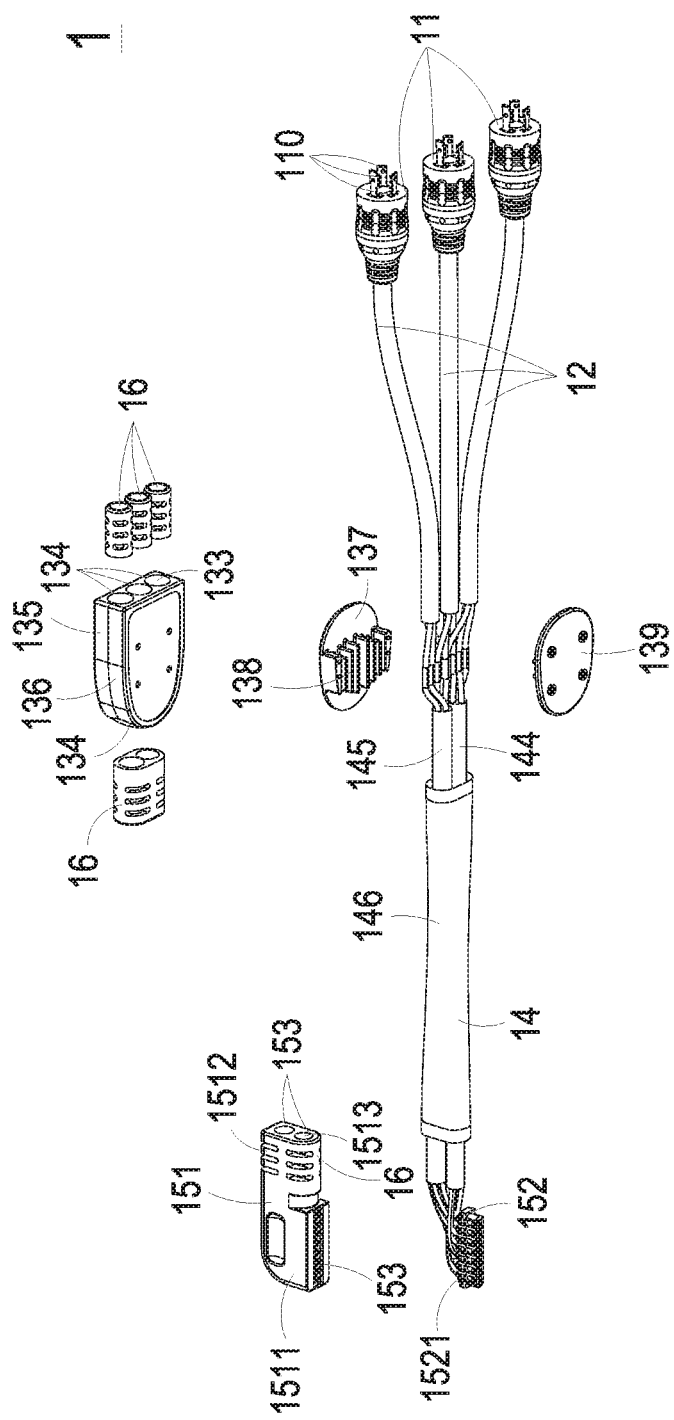
FIG. 3 is a partially explored view showing the AC power adapter of FIG. 1.
Figure 4C:
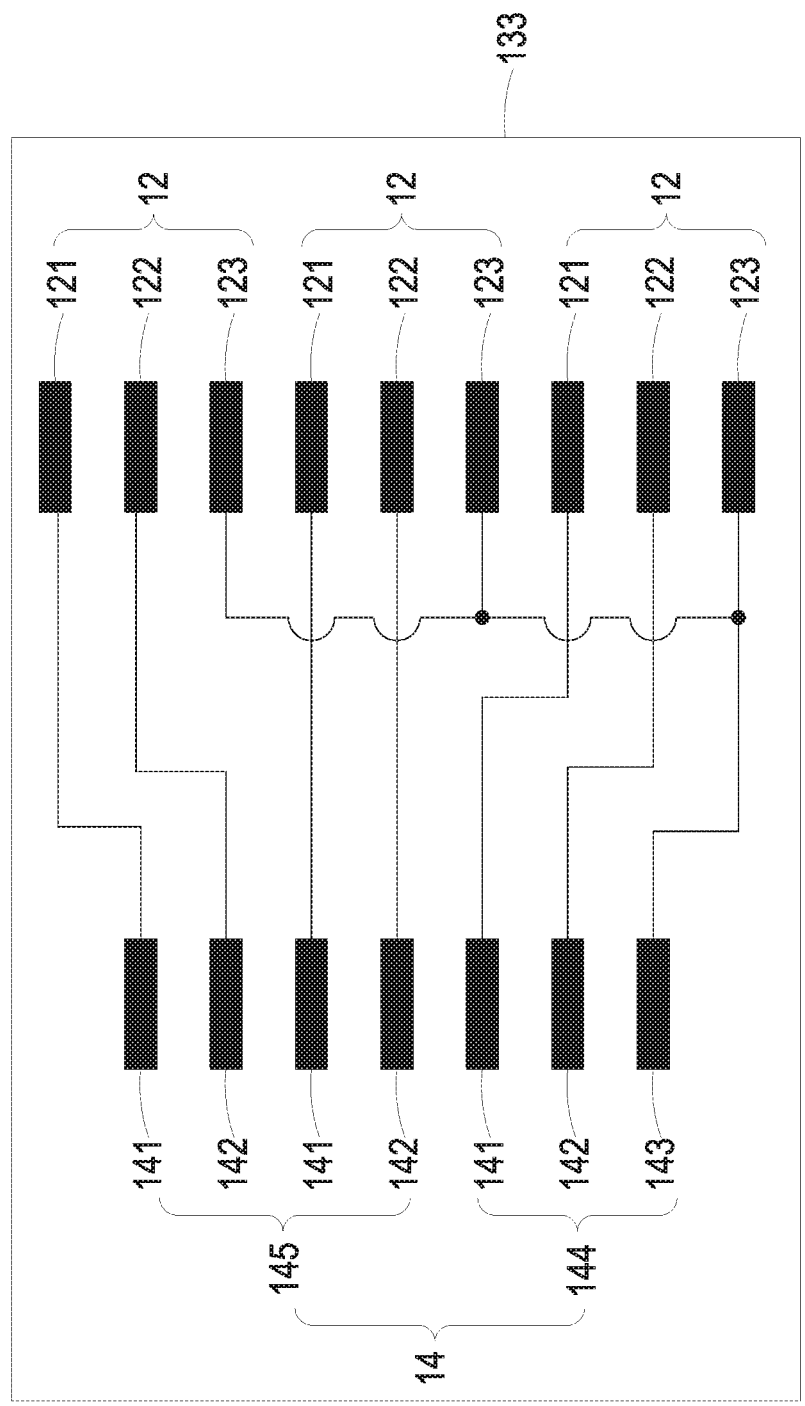
FIG. 4C is a schematic view showing the connections between the first power conveying wires and the power conveying wire assembly in the first accommodation space of the junction box.

FIG. 1 is a schematic perspective view illustrating an AC power adapter according to an embodiment of the present disclosure, FIG. 2 is a schematic perspective view illustrating the AC power adapter of FIG. 1 at another viewing angle, FIG. 3 is a partially explored view showing the AC power adapter of FIG. 1, FIG. 4A is a cross-sectional view showing the first power conveying wire of FIG. 1 along the section AA, FIG. 4B is a cross-sectional view showing the power conveying wire assembly of FIG. 1 along the section BB, and FIG. 4C is a schematic view showing the connections between the first power conveying wires and the power conveying wire assembly in the first accommodation space of the junction box. As shown in FIGS. 1, 2, 3, 4A, 4B and 4C, the AC power adapter 1 includes plural connectors 11, plural first power conveying wires 12, a junction box 13, a power conveying wire assembly 14 and a plug 15. Each of the connectors 11 is configured to receive a single-phase AC power. The plural first power conveying wires 12 are connected with the plural connectors 11 one-to-one. Each of the first power conveying wires 12 includes an input neutral wire 121, an input live wire 122 and an input ground wire 123. The input neutral wire 121, the input live wire 122 and the input ground wire 123 are insulated from each other. The junction box 13 includes a first accommodation space 133. Each of the plural first power conveying wires 12 are at least partially inserted into the first accommodation space 133 separately. The power conveying wire assembly 14 is at least partially inserted into the first accommodation space 133 and includes plural output neutral wires 141, plural output live wires 142 and an output ground wire 143. The plural output neutral wires 141, the plural output live wires 142 and the output ground wire 143 are insulated from each other. In the first accommodation space 133, the plural output neutral wires 141 are connected with the plural input neutral wires 121 of the plural first power conveying wires 12 one-to-one, the plural output live wires 142 are connected with the plural input live wires 122 of the plural first power conveying wires 12 one-to-one, and the output ground wire 143 is connected with the plural input ground wires 123 of the plural first power conveying wires 12. The plug 15 includes a housing 151 and an electrical connector 152. The electrical connector 152 is engaged or embedded in the housing 151. The power conveying wire assembly 14 is at least partially inserted into the housing 151 and is electrically connected with the electrical connector 152.

Please refer to FIGS. 1, 2, 3, 4A, 4B and 4C again. In an embodiment, the AC power adapter 1 includes three connectors 11, three first power conveying wires 12, a junction box 13, a power conveying wire assembly 14 and a plug 15.

The connector 11 is configured to receive the single-phase AC power, and the three connectors 11 can receive three single-phase AC powers. The three first power conveying wires 12 are connected with the three connectors 11 respectively. As shown in FIG. 4A, each of the first power conveying wires 12 includes an input neutral wire 121, an input live wire 122 and an input ground wire 123. The input neutral wire 121, the input live wire 122 and the input ground wire 123 are insulated from each other, and each one of them is wrapped by the insulation material. In an embodiment, each of the connectors 11 includes three conducting pins 110. The three conducting pins 110 are connected with the input neutral wire 121, the input live wire 122 and the input ground wire 123 of the corresponding first power conveying wire 12 respectively (not shown).

The junction box 13 includes an input end part 131, an output end part 132 and a first accommodation space 133. The input end part 131 has three apertures 134, and the output end part 132 has one aperture 134. The apertures 134 of the input end part 131 and the output end part 132 are in communication with the first accommodation space 133 separately. The three first power conveying wires 12 are at least partially inserted into the first accommodation space 133 through the three apertures 134 of the input end part 131 respectively. In an embodiment, the junction box 13 is for example but not limited to be constituted by a first casing component 135 and a second casing component 136, and the first casing component 135 is assembled with the second casing component 136 so as to form the first accommodation space 133. In an embodiment, the junction box 13 further includes a separating base 137, plural separating plates 138 and a cover plate 139. The separating base 137, the separating plates 138 and the cover plate 139 are disposed within the first accommodation space 133. The plural separating plates 138 are mounted on the separating base 137 and are configured to form plural wiring channels, so that part of the wires of the three first power conveying wires 12 and/or part of the wires of the power conveying wire assembly 14 are accommodated in the wiring channels respectively and accordingly. The cover plate 139 is mounted relative to the separating plates 138 and is configured to retain the wires in the wiring channels.

The power conveying wire assembly 14 is at least partially inserted into the first accommodation space 133 through the aperture 134 of the output end part 132. As shown in FIG. 4B, the power conveying wire assembly 14 includes three output neutral wires 141, three output live wires 142 and an output ground wire 143. The output neutral wires 141, the output live wires 142 and the output ground wire 143 are insulated from each other, and each one of them is wrapped by the insulation material. In the first accommodation space 133 of the junction box 13, the connections between the three first power conveying wires 12 and the power conveying wire assembly 14 are shown in FIG. 4C. The three output neutral wires 141 are connected with the three input neutral wires 121 of the three first power conveying wires 12 respectively. The three output live wires 142 are connected with the three input live wires 122 of the three first power conveying wires 12 respectively. The output ground wire 143 is connected with the three input ground wires 123 of the three first power conveying wires 12. The connection way between the wires is for example but not limited to welding.

The plug 15 includes a housing 151 and an electrical connector 152. The housing 151 includes a first end part 1511, a second end part 1512 and a second accommodation space 1513. The first end part 1511 and the second end part 1512 individually have an aperture 153 in communication with the second accommodation space 1513. The electrical connector 152 is engaged or embedded in the aperture 153 of the first end part 1511, partially located in the second accommodation space 1513, and partially exposed from the first end part 1511. The power conveying wire assembly 14 is at least partially inserted into the second accommodation space 1513 through the aperture 153 of the second end part 1512. Therefore, the power conveying wire assembly 14 is electrically connected with the electrical connector 152.

In an embodiment, among the three first power conveying wires 12, the input neutral wire 121 and the input live wire 122 of one of the first power conveying wires 12 are a first input neutral wire and a first input live wire respectively, the input neutral wire 121 and the input live wire 122 of another first power conveying wire 12 are a second input neutral wire and a second input live wire respectively, and the input neutral wire 121 and the input live wire 122 of the other first power conveying wire 12 are a third input neutral wire and a third input live wire respectively. The three output neutral wires 141 of the power conveying wire assembly 14 are a first output neutral wire, a second output neutral wire and a third output neutral wire respectively. The three output live wires 142 of the power conveying wire assembly 14 are a first output live wire, a second output live wire and a third output live wire respectively. The first output neutral wire, the second output neutral wire, the third output neutral wire, the first output live wire, the second output live wire and the third output live wire are connected with the first input neutral wire, the second input neutral wire, the third input neutral wire, the first input live wire, the second input live wire and the third input live wire respectively. In an embodiment, the electrical connector 152 includes seven pins 1521. The pins 1521 are separated and insulated from each other. The seven pins 1521 are arranged in a line and are electrically connected with the seven wires of the power conveying wire assembly 14 respectively. In an embodiment, the seven pins 1521 are electrically connected with the output ground wire 143, the first output live wire, the first output neutral wire, the second output live wire, the second output neutral wire, the third output live wire and the third output neutral wire respectively, but not exclusively.

In an embodiment, the wires of the power conveying wire assembly 14 form a second power conveying wire 144 and a third power conveying wire 145. As shown in FIG. 4B, the second power conveying wire 144 includes three wires of the power conveying wire assembly 14, such as the output ground wire 143, the first output live wire and the first output neutral wire, but not exclusively. The third power conveying wire 145 includes four wires of the power conveying wire assembly 14, such as the second output live wire, the second output neutral wire, the third output live wire and the third output neutral wire, but not exclusively. In an embodiment, the second end part 1512 of the housing 151 of the plug 15 has two apertures 153. Therefore, the second power conveying wire 144 and the third power conveying wire 145 are at least partially inserted into the second accommodation space 1513 through the two apertures 153 of the second end part 1512 respectively.

In an embodiment, the power conveying wire assembly 14 further includes an adhesive tape 146. The adhesive tape 146 is configured to wrap and retain the second power conveying wire 144 and the third power conveying wire 145. The adhesive tape 146 is for example but not limited to a self-adhesive rubber tape. In an embodiment, the AC power adapter 1 further includes plural insulating members 16. The insulating members 16 are mounted on the input end part 131 and the output end part 132 of the junction box 13 and the second end part 1512 of the plug 15. The insulating members 16 are configured to wrap part of first power conveying wire 12 and the power conveying wire assembly 14 near the end parts, so as to protect the first power conveying wire 12 and the power conveying wire assembly 14 from break caused by bending.

From the above descriptions, the AC power adapter 1 according to an embodiment of the present disclosure receives three single-phase AC powers. In the junction box 13, by the connections between the wires of the three first power conveying wires 12 and the wires of the power conveying wire assembly 14, the electrical connector 152 of the plug 15 provides three single-phase AC powers sharing ground wire to the power distribution shelf electrically connected therewith.

Figure 5:
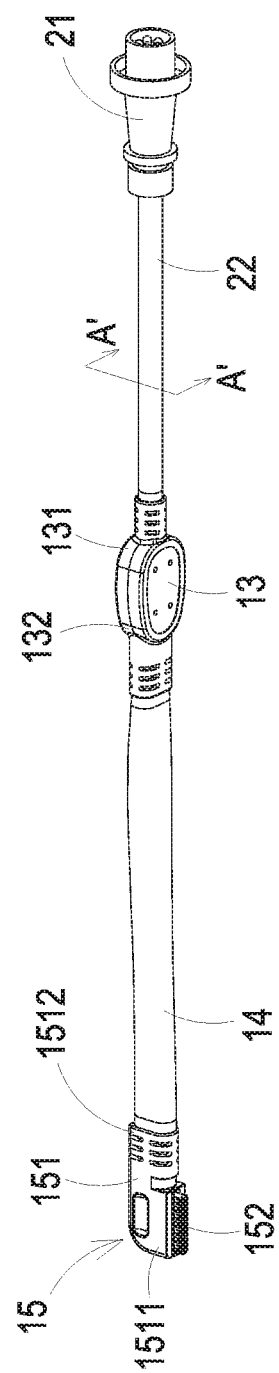
FIG. 5 is a schematic perspective view illustrating an AC power adapter according to another embodiment of the present disclosure.
Figure 6:
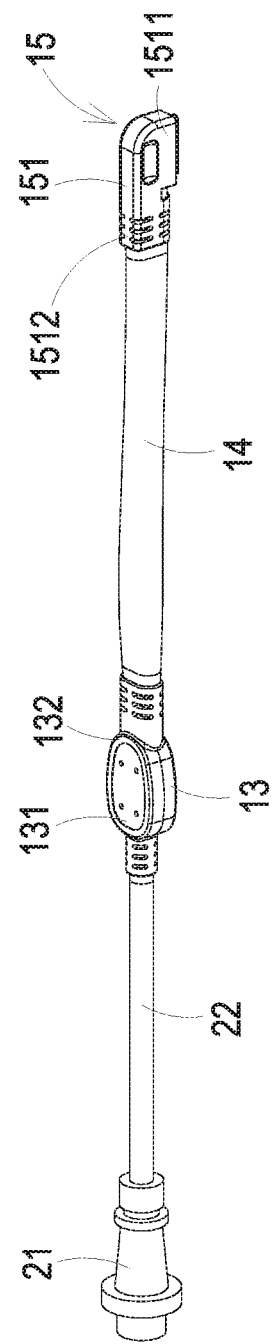
FIG. 6 is a schematic perspective view illustrating the AC power adapter of FIG. 5 at another viewing angle.
Figure 7:
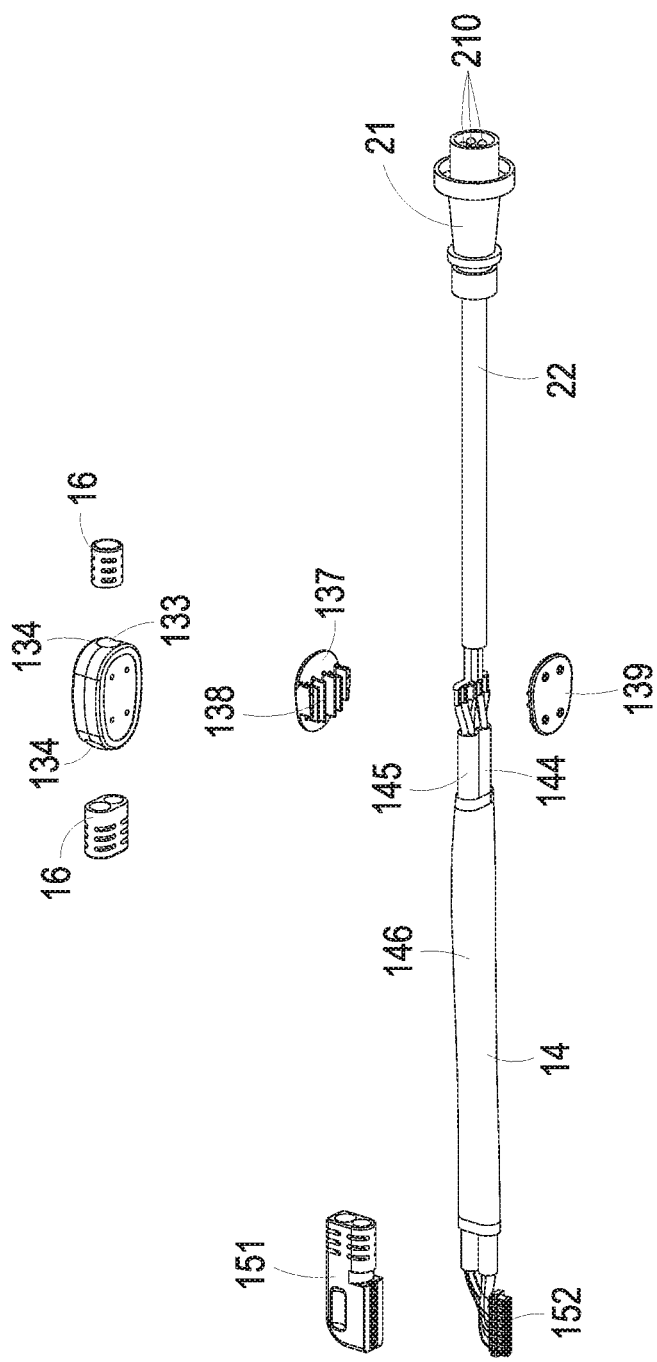
FIG. 7 is a partially exploded view showing the AC power adapter of FIG. 5.
Figure 8A:
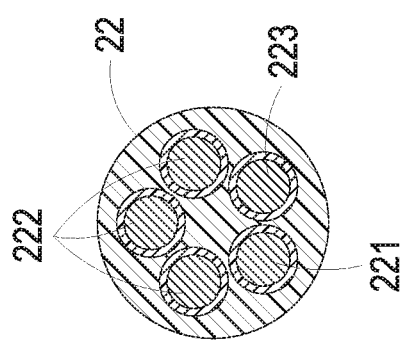
FIG. 8A is a cross-sectional view showing the first power conveying wire of FIG. 5 along the section A'A'.
Figure 8B:
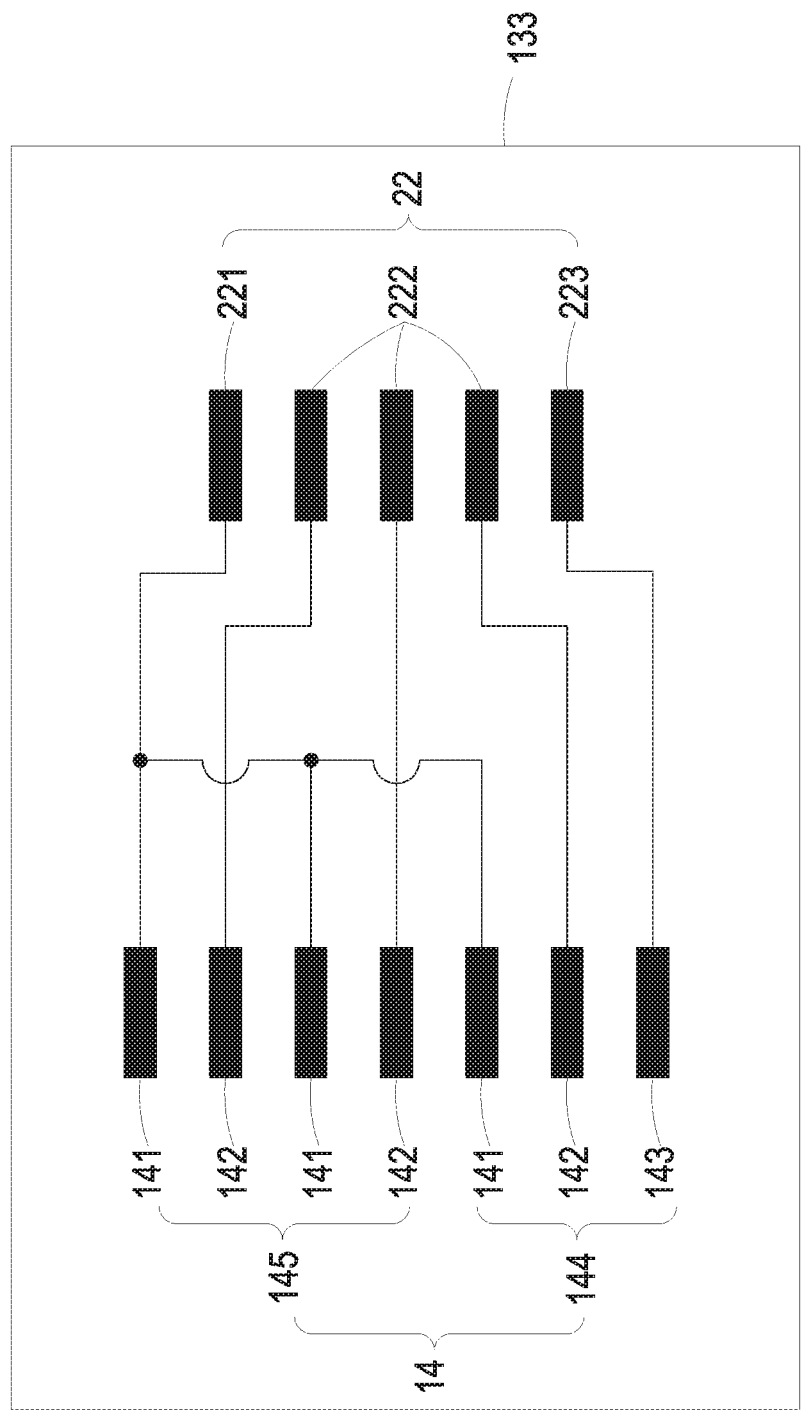
FIG. 8B is a schematic view showing the connections between the first power conveying wire and the power conveying wire assembly in the first accommodation space of the junction box.

FIG. 5 is a schematic perspective view illustrating an AC power adapter according to another embodiment of the present disclosure, FIG. 6 is a schematic perspective view illustrating the AC power adapter of FIG. 5 at another viewing angle, FIG. 7 is a partially explored view showing the AC power adapter of FIG. 5, FIG. 8A is a cross-sectional view showing the first power conveying wire of FIG. 5 along the section A'A', and FIG. 8B is a schematic view showing the connections between the first power conveying wire and the power conveying wire assembly in the first accommodation space of the junction box. The component parts and elements similar to that of FIGS. 1, 2, 3, 4A, 4B and 4C are designated by identical numeral references, and are not redundantly described herein. As shown in FIGS. 5, 6, 7, 8A and 8B, the AC power adapter 2 includes a connector 21, a first power conveying wire 22, a junction box 13, a power conveying wire assembly 14 and a plug 15. The connector 21 is configured to receive a three-phase AC power. The first power conveying wire 22 is connected with the connector 21 and includes an input neutral wire 221, plural input live wires 222 and an input ground wire 223. The input neutral wire 221, the input live wires 222 and the input ground wire 223 are insulated from each other. The junction box 13 includes a first accommodation space 133. The first power conveying wire 22 are at least partially inserted into the first accommodation space 133. The power conveying wire assembly 14 is at least partially inserted into the first accommodation space 133 and includes plural output neutral wires 141, plural output live wires 142 and an output ground wire 143. The output neutral wires 141, the output live wires 142 and the output ground wire 143 are insulated from each other. In the first accommodation space 133, the output neutral wires 141 are all connected with the input neutral wire 221 of the first power conveying wire 22, the output live wires 142 are connected with the input live wires 222 of the first power conveying wire 22 one-to-one, and the output ground wire 143 is connected with the input ground wire 223 of the first power conveying wire 22. The plug 15 includes a housing 151 and an electrical connector 152. The electrical connector 152 is engaged or embedded in the housing 151. The power conveying wire assembly 14 is at least partially inserted into the housing 151 and is electrically connected with the electrical connector 152.

Please refer to FIGS. 5, 6, 7, 8A and 8B again. In an embodiment, the AC power adapter 2 includes one single connector 21 and one single first power conveying wire 22. The connector 21 is configured to receive the three-phase AC power. The first power conveying wire 22 is connected with the connector 21. As shown in FIG. 8A, the first power conveying wire 22 includes an input neutral wire 221, three input live wires 222 and an input ground wire 223. The input end part 131 of the junction box 13 is changed to have one aperture 134, and the first power conveying wire 22 is at least partially inserted into the first accommodation space 133 through the aperture 134 of the input end part 131. In an embodiment, the connector 21 includes five conducting pins 210. The five conducting pins 210 are connected with the input neutral wire 221, the three input live wires 222 and the input ground wire 223 of the first power conveying wire 22 respectively.

In this embodiment, in the first accommodation space 133 of the junction box 13, the connections between the first power conveying wire 22 and the power conveying wire assembly 14 are shown in FIG. 8B. The three output neutral wires 141 of the power conveying wire assembly 14 are all connected with the input neutral wire 221 of the first power conveying wire 22. The three output live wires 142 of the power conveying wire assembly 14 are connected with the three input live wires 222 of the first power conveying wire 22 respectively. The output ground wire 143 of the power conveying wire assembly 14 is connected with the input ground wire 223 of the first power conveying wire 22.

In an embodiment, the three input live wires 222 of the first power conveying wire 22 are a first input live wire, a second input live wire and a third input live wire respectively. The first output live wire, the second output live wire and the third output live wire of the power conveying wire assembly 14 are connected with the first input live wire, the second input live wire and the third input live wire of the first power conveying wire 22 respectively. The first output neutral wire, the second output neutral wire and the third output neutral wire of the power conveying wire assembly 14 are connected with the input neutral wire 221 of the first power conveying wire 22.

From the above descriptions, the AC power adapter 2 according to another embodiment of the present disclosure receives a three-phase AC power. In the junction box 13, by the connections between the wires of the first power conveying wire 22 and the wires of the power conveying wire assembly 14, the electrical connector 152 of the plug 15 provides three single-phase AC powers sharing ground wire to the power distribution shelf electrically connected therewith.

Figure 9A:
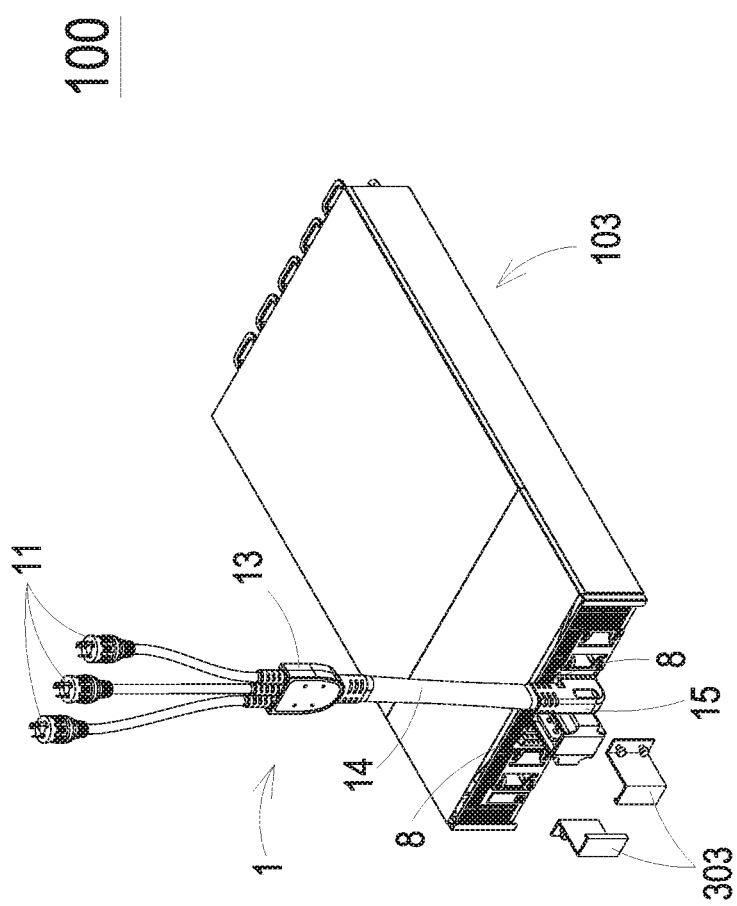
FIG. 9A is a schematic perspective view illustrating a power distribution system according to an embodiment of the present disclosure.
Figure 11:
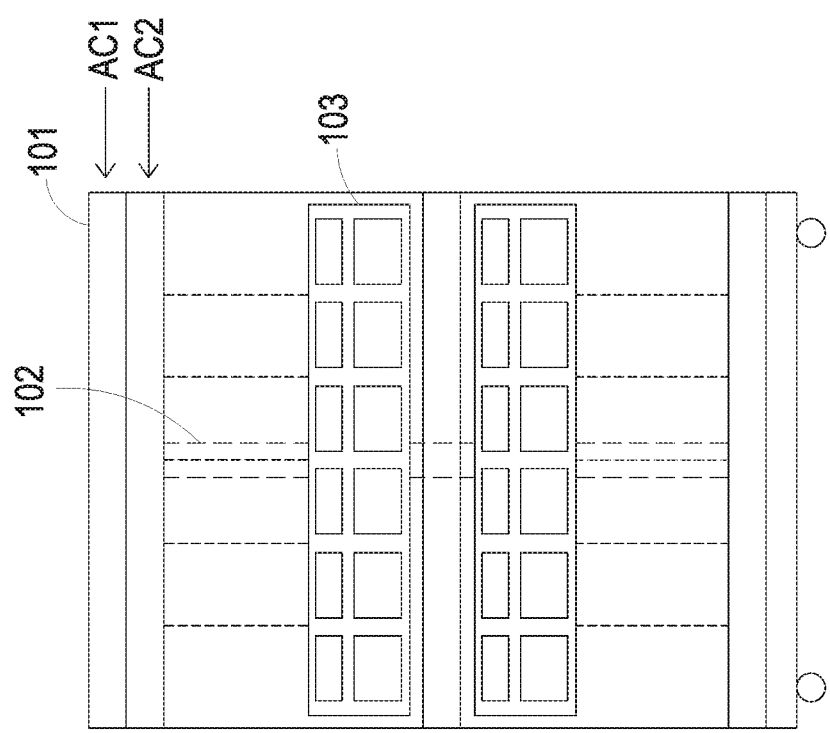
FIG. 11 is a block diagram illustrating an example of the multiple input power distribution shelf of FIG. 9A disposed on a server rack.

The above-mentioned AC power adapter (1, 2) is capable of use with the power distribution shelf, and thus it is unnecessary to design a corresponding connector for the power distribution shelf in accordance with different input power. FIG. 9A is a schematic perspective view illustrating a power distribution system according to an embodiment of the present disclosure, FIG. 9B is a schematic view showing the power distribution system of FIG. 9A disposed on a server rack, FIG. 9C is a side view showing the power distribution system and the server rack of FIG. 9B, and FIG. 11 is a block diagram illustrating an example of the multiple input power distribution shelf of FIG. 9A disposed on a server rack. As shown in FIG. 9A, the power distribution system 100 includes at least one AC power adapter 1 and a multiple input power distribution shelf 103 (hereinafter also referred to as power distribution shelf). The AC power adapter 1 is electrically connected with the power distribution shelf 103. The AC power adapter 1 is configured to receive and adapt three single-phase AC powers to three single-phase AC powers sharing ground wire, and provides the three single-phase AC powers sharing ground wire to the power distribution shelf 103. The AC power adapter 1 is for example but not limited to receive the AC power from the external power source or the PDU (Power Distribution Unit). As shown in FIG. 11, the power distribution shelf 103 is installed in the server rack 101 and can be drawn out from the server rack 101 for maintenances. The power distribution shelf 103 converts the received AC input power into DC output power and provides the DC output power to the rack bus bar 102 of the server rack 101. When the power distribution system 100 is mounted on the server rack 101, the relative positions among the AC power adapter 1, the power distribution shelf 103 and the server rack 101 are shown in FIGS. 9B and 9C. The AC power adapter 1 is wired along the rack structure of the server rack 101. The wires of the AC power adapter 1, such as the first power conveying wire 12, the second power conveying wire 144 and the third power conveying wire 145, are flexible so as to prevent break caused by bending during wiring. In an embodiment, the adhesive tape 146 of the power conveying wire assembly 14 of the AC power adapter 1 uses heat insulation material. In an embodiment, the two AC power adapters 1 receive different AC power, and the power distribution shelf 103 is connected with the two AC power adapters 1. Therefore, when one of the AC powers is outage, the power distribution shelf 103 still can provide uninterrupted DC output power to the server rack 101 by receiving the other AC power.

Alternatively, in an embodiment, as shown in FIG. 10A, the power distribution system 100 is changed to include at least one AC power adapter 2 and the power distribution shelf 103. The AC power adapter 2 is configured to receive and adapt a three-phase AC power to three single-phase AC powers sharing ground wire, and provides the three single-phase AC powers sharing ground wire to the power distribution shelf 103. When the power distribution system 100 is mounted on the server rack 101, the relative positions among the AC power adapter 2, the power distribution shelf 103 and the server rack 101 are shown in FIGS. 10B and 10C. The AC power adapter 2 is wired along the rack structure of the server rack 101. The wires of the AC power adapter 2, such as the first power conveying wire 22, the second power conveying wire 144 and the third power conveying wire 145, are flexible so as to prevent break caused by bending during wiring.

An example of the power distribution shelf 103 of the power distribution system 100 is described in detail with FIGS. 12A to 20 as follows.

Figure 12A:
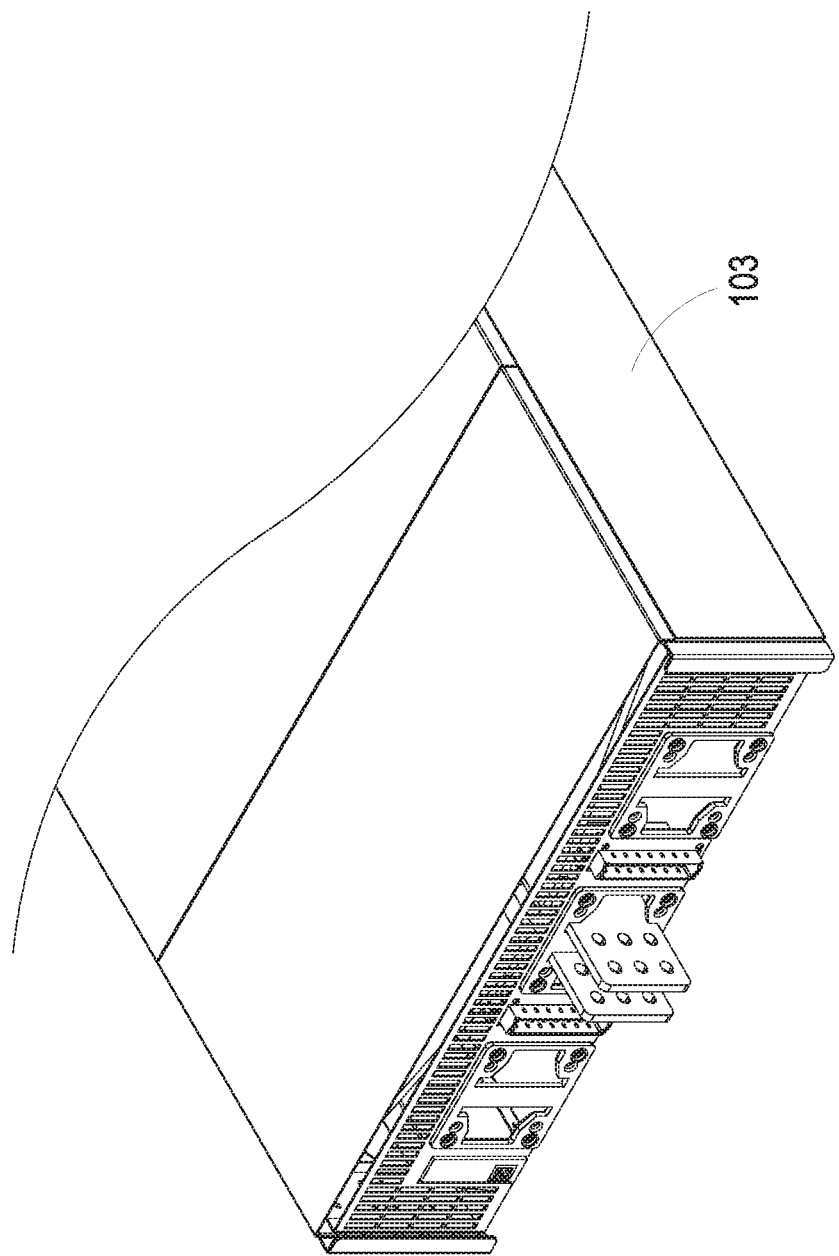
FIG. 12A is a schematic perspective view illustrating a rear portion of the multiple input power distribution shelf of FIG. 9A.
Figure 12B:
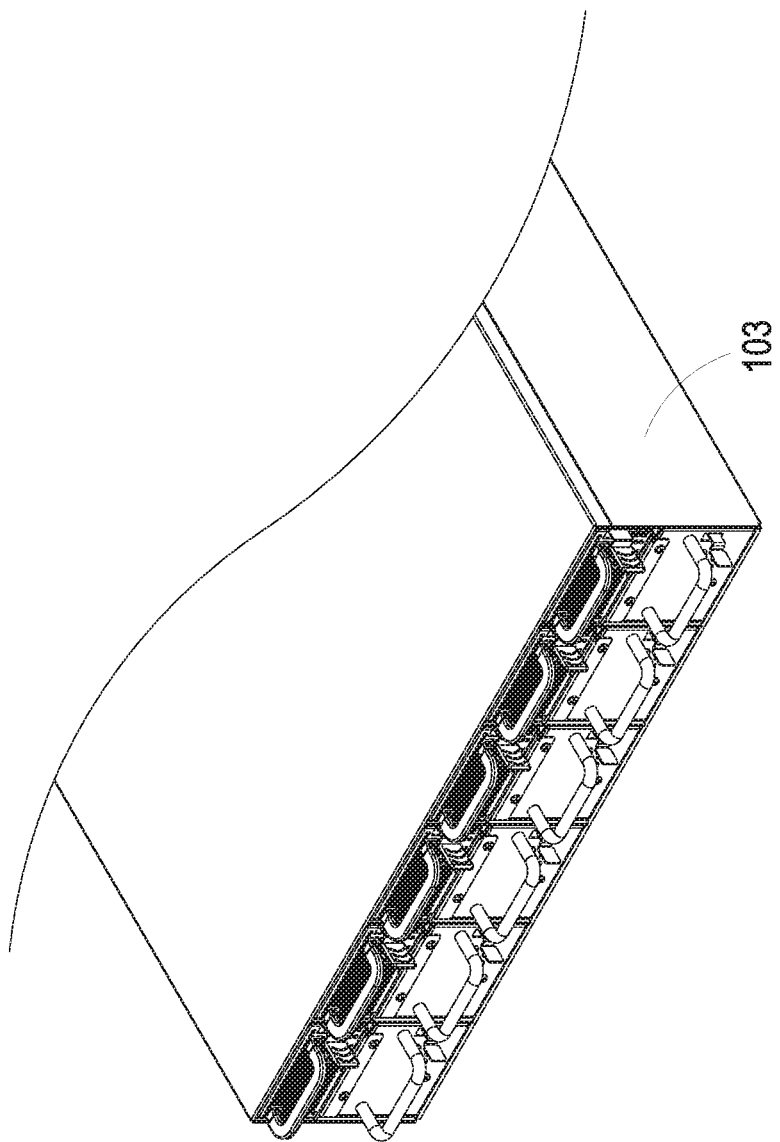
FIG. 12B is a schematic perspective view illustrating a front portion of the multiple input power distribution shelf of FIG. 12A.
Figure 13:
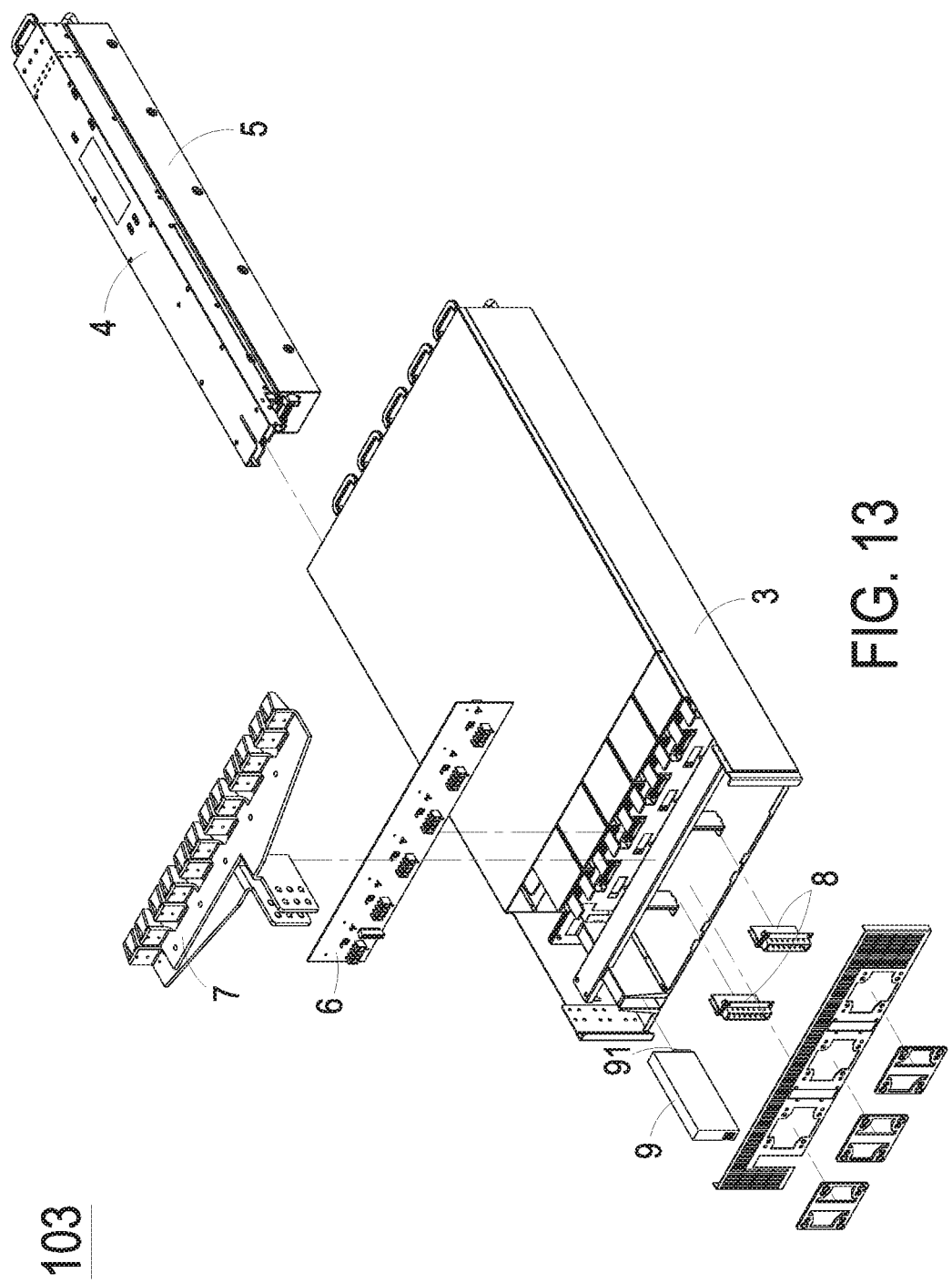
FIG. 13 is an explored view showing the multiple input power distribution shelf of FIG. 12A.

FIG. 12A is a schematic perspective view illustrating a rear portion of the multiple input power distribution shelf of FIG. 9A, FIG. 12B is a schematic perspective view illustrating a front portion of the multiple input power distribution shelf of FIG. 12A, and FIG. 13 is an explored view showing the multiple input power distribution shelf of FIG. 12A. As shown in FIGS. 12A, 12B and 13, the power distribution shelf 103 includes a chassis 3, a plurality of power supply units 4, a plurality of battery backup units 5, a mid-plane circuit board 6, a bus bar assembly 7, a plurality of AC input power connectors 8 and a power shelf controller 9. The power supply units 4, the battery backup units 5, the mid-plane circuit board 6, the bus bar assembly 7, the AC input power connectors 8 and the power shelf controller 9 are installed and mounted in the chassis 3. The power supply units 4 are electrically connected with the AC input power connectors 8 via the mid-plane circuit board 6 and plural power cables (not shown), the power supply units 4 are electrically connected with the battery backup units 5 via the mid-plane circuit board 6. The power supply units 4 are electrically connected with the rack bus bar 102 (see FIG. 11) via the bus bar assembly 7. The power shelf controller 9 is electrically connected with the power supply units 4 and the battery backup units 5 via the mid-plane circuit board 6.

Figure 14A:
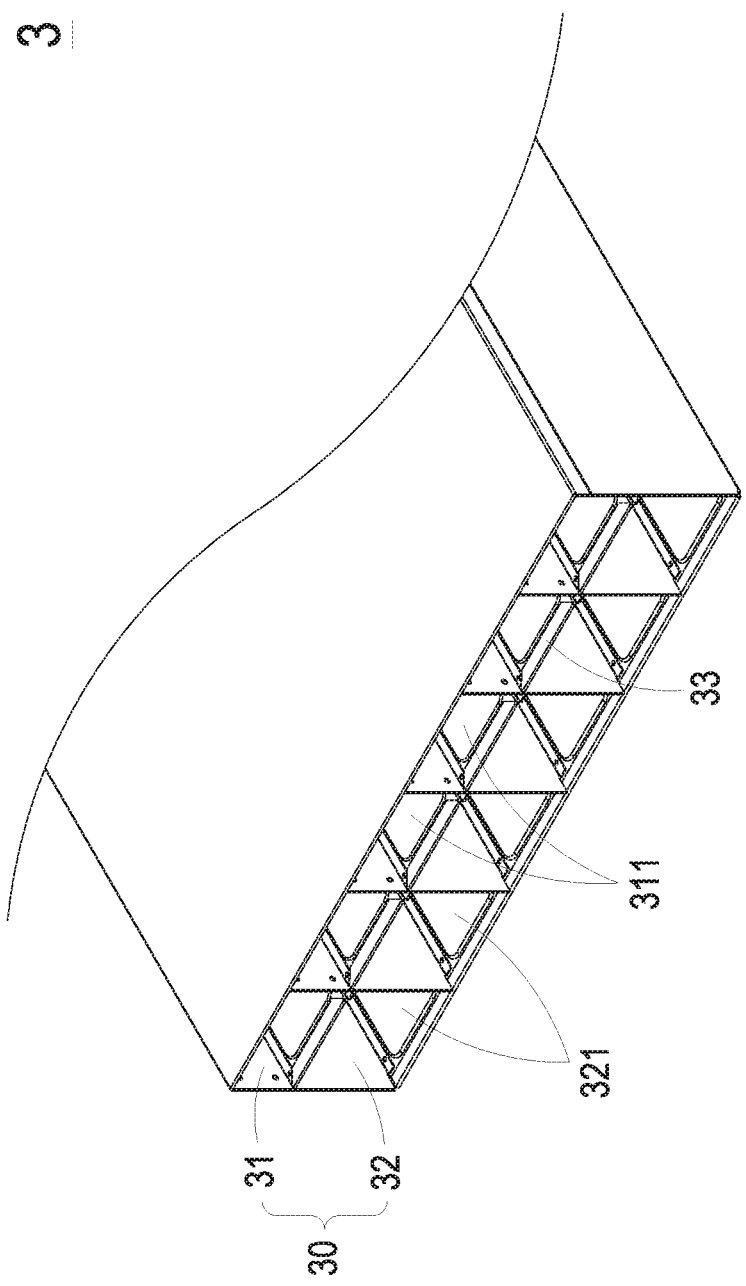
FIG. 14A is a schematic perspective view illustrating a front portion of the chassis of the multiple input power distribution shelf of FIG. 12A.

FIG. 14A is a schematic perspective view illustrating a front portion of the chassis of the multiple input power distribution shelf of FIG. 12A, and FIG. 14B is an explored view showing a rear portion of the chassis of FIG. 14A. As shown in FIGS. 13, 14A and 14B, the chassis 3 includes a first receiving space 30 having a first compartment 31 and a second compartment 32. The first compartment 31 and the second compartment 32 are separated by a plate 33. The first compartment 31 has a plurality of first slots 311, and the second compartment 32 has a plurality of second slots 321. The first slots 311 and the second slot 321 are defined by a plurality of baffles 34 within the first compartment 31 and the second compartment 32. The chassis 3 further includes a partition plate 35, a first bracket 36 and a second bracket 37. The partition plate 35 is disposed in the first receiving space 30 and located at the rear portion of the chassis 3 and covers the rear openings of the second slots 321 and portions of the rear openings of the first slots 311. The partition plate 35 has a plurality of first through holes 351 corresponding to the first slots 311 and a plurality of second through holes 352 corresponding to the second slots 321. Preferably but not exclusively, the first bracket 36 is a transverse strip disposed in the first receiving space 30 and connected to two opposite sidewalls of the chassis 3. The first bracket 36 is configured to support the bus bar assembly 7. In an embodiment, the chassis 3 further includes at least one supporting pillar 361, such as the two supporting pillars 361 shown in FIG. 14B. One terminal of the supporting pillar 361 is connected to the first bracket 36, and the other terminal of the supporting pillar 361 is connected to the inner surface of the bottom plate of the chassis 3. The supporting pillar 361 is configured to support the first bracket 36 so that the first bracket 36 supports the bus bar assembly 7 more stably. The second bracket 37 is a U-shaped frame disposed in the first receiving space 30, and mounted on the inner surface of the bottom plate of the chassis 3. The second bracket 37 forms a second receiving space 371 for accommodating the power shelf controller 9 therein and has a top surface 372 for supporting the first bracket 36. The chassis 3 has a top cover 38, and the top cover 38 is detachably covering the rear portion of the chassis 3.

The power supply units 4 are hot-swappable and detachably installed into the first slots 311 of the first compartment 31 respectively, and the battery backup units 5 are hot-swappable and detachably installed into the second slots 321 of the second compartment 32 respectively. Preferably but not exclusively, the first compartment 31 has six first slots 311, and the second compartment 32 has six second slot 321. The first slots 311 are corresponding to and aligned with the second slots 321 respectively. Namely, the six power supply units 4 are installed into the six first slots 311 respectively, and the six battery backup units 5 are installed into the six second slots 321 respectively. In this embodiment, the partition plate 35 further includes a plurality of first protrusions 353 and a plurality of second protrusions 354, and each of the baffles 34 has a hook 341 formed at an edge thereof and extending outwardly from the edge. The chassis 3 further includes a rear plate 39 connected with the rear portion of the chassis 3.

Figure 15:
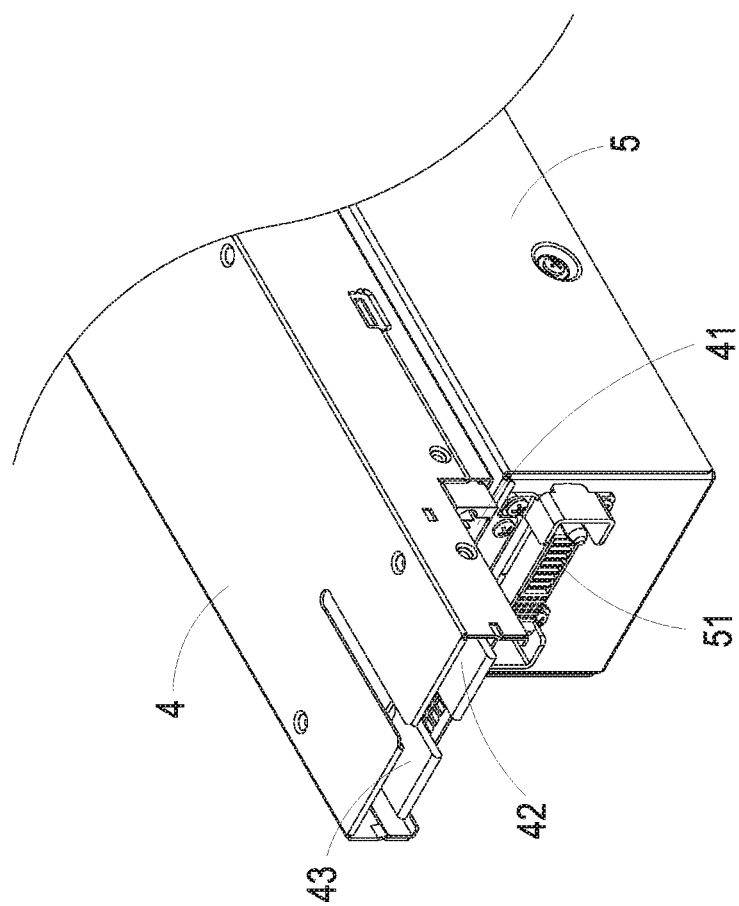
FIG. 15 is a schematic perspective view illustrating the power supply unit and the battery backup unit of the power distribution shelf of FIG. 12A.

FIG. 15 is a schematic perspective view illustrating the power supply unit and the battery backup unit of the power distribution shelf of FIG. 12A. As shown in FIG. 15, each of the power supply units 4 has a first connection interface 41, a first power output electrode 42 and a second power output electrode 43. The first connection interface 41 is located under the first power output electrode 42 and the second power output electrode 43. Preferably but not exclusively, the first power output electrode 42 and the second power output electrode 43 are copper sheets. Each of the battery backup units 5 has a second connection interface 51. Preferably but not exclusively, the second connection interface 51 is floating and mounted on the rear of the battery backup unit 5. In an embodiment, the outer edge of partial housing of the power supply unit 4 is aligned with the outer edges of the first power output electrode 42 and the second power output electrode 43. Therefore, the first power output electrode 42 and the second power output electrode 43 are protected from bending and break during inserting or pulling out the power supply unit 4.

Figure 16A:
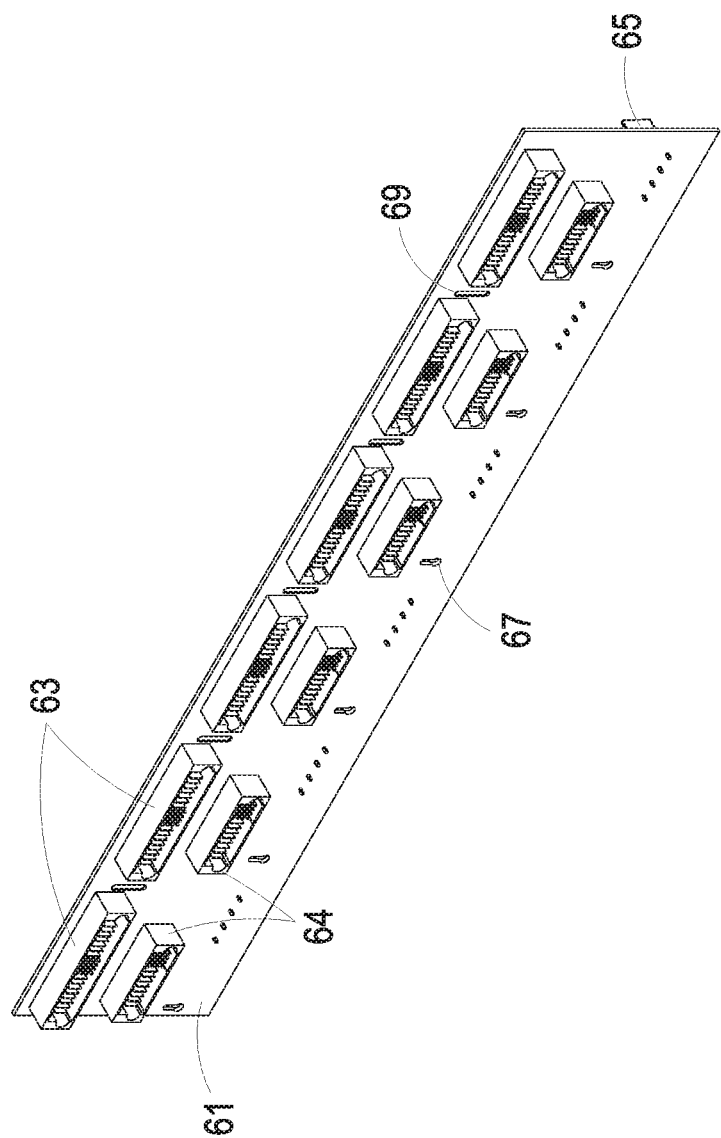
FIGS. 16A, 16B and 16C are schematic perspective views illustrating the mid-plane circuit board of the power distribution shelf of FIG. 12A at various viewing angles.
Figure 16B:
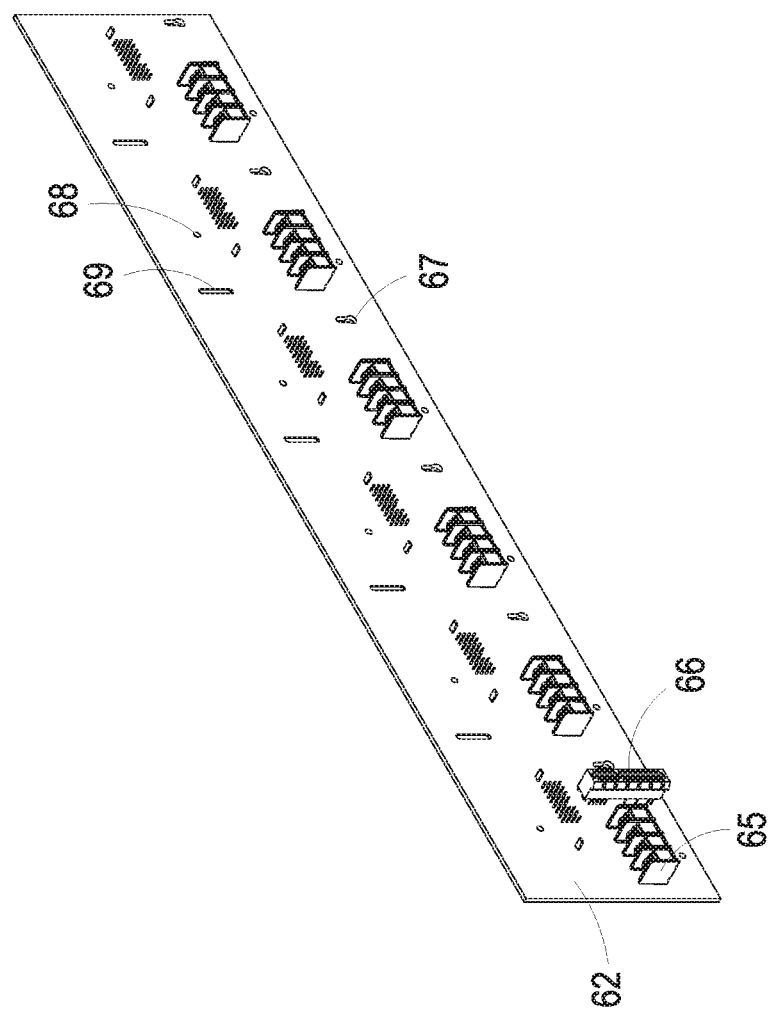
Figure 16D:
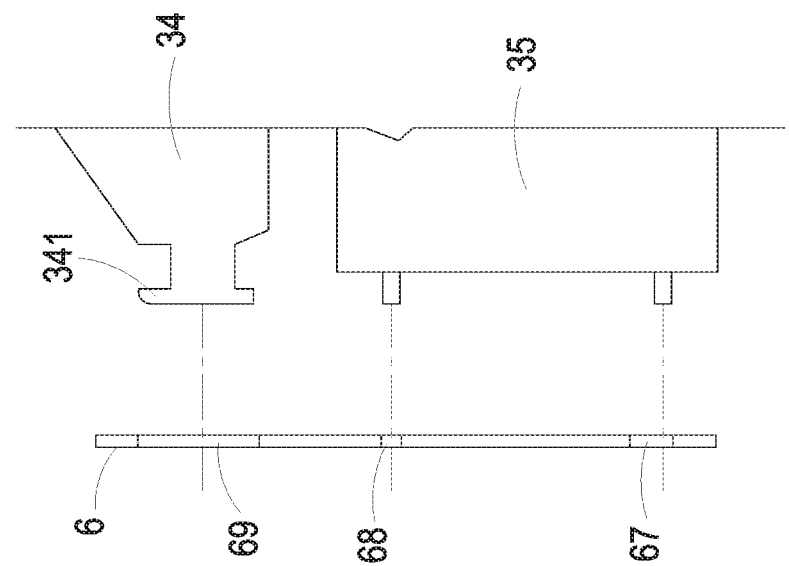
FIG. 16D is a schematic view showing the mid-plane circuit board fastened by the partition plate and the baffles of the chassis.
Figure 16C:
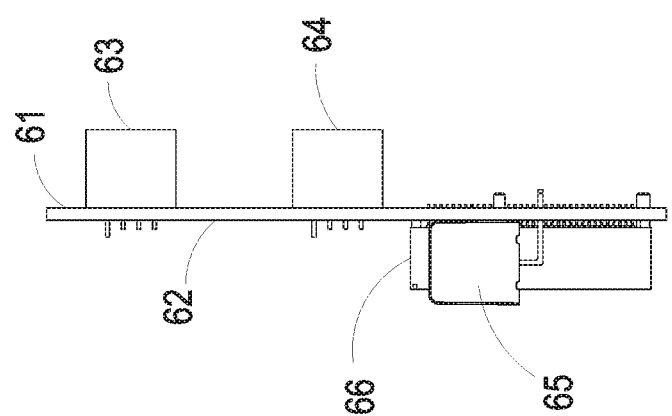

FIGS. 16A, 16B and 16C are schematic perspective views illustrating the mid-plane circuit board of the power distribution shelf of FIG. 12A at various viewing angles, and FIG. 16D is a schematic view showing the mid-plane circuit board fastened by the partition plate and the baffles of the chassis. As shown in FIGS. 16A, 16B and 16C, the mid-plane circuit board 6 includes a first surface 61, a second surface 62, a plurality of first connectors 63, a plurality of second connectors 64, a plurality of third connectors 65, and a fourth connector 66. The first connectors 63 are mounted on the first surface 61, arranged in a first line and aligned and mating with the first connection interfaces 41 (see FIG. 15) of the power supply units 4 respectively and correspondingly. The second connectors 64 are mounted on the first surface 61, arranged in a second line and aligned and mating with the second connection interfaces 51 (see FIG. 15) of the battery backup units 5 respectively and correspondingly. The third connectors 65 are mounted on the second surface 62 and arranged in a third line. Each of the third connector 65 is electrically connected with two of the AC input power connectors 8 via plural power cables 81 (see FIG. 17C). The fourth connector 66 is mounted on the second surface 62 and configured to electrically connect with a third connection interface 91 (see FIG. 13) of the power shelf controller 9. As shown in FIGS. 16A, 16B and 16D, the mid-plane circuit board 6 includes a plurality of first fixing holes 67, a plurality of second fixing holes 68, and a plurality of third fixing holes 69. The first fixing holes 67 are corresponding to and engaging with the first protrusions 353 of the partition plate 35 respectively, the second fixing holes 68 are corresponding to and engaging with the second protrusion 354 of the partition plate 35 respectively, and the third fixing holes 69 are corresponding to and engaging with the hooks 341 of the baffles 34 respectively. Consequently, the mid-plane circuit board 6 can be fastened in the chassis 3 via the partition plate 35 and the battles 34. Preferably, the mid-plane circuit board 6 is vertical to the bottom plate of the chassis 3.

In an embodiment, the mid-plane circuit board 6 has six first connectors 63, six second connectors 64, six third connectors 65 and one fourth connector 66. Each of the first connectors 63 has a first group of pins electrically coupled with the power pins of a corresponding third connector 65 by the trace patterns of the mid-plane circuit board 6. Consequently, the AC input power from the two AC power sources can be transferred to the corresponding power supply unit 4 via the first connector 63 and the third connector 65. Each of the first connector 63 has a second group of pins electrically coupled with the power pins of a corresponding second connector 64 by the trace patterns of the mid-plane circuit board 6. Consequently, the battery backup unit 5 can discharge DC voltage to the corresponding power supply unit 4 and/or the power supply units 4 can charge the DC voltage to the battery backup unit 5 via the first connector 63 and the second connector 64. Each of the first connector 63 has a third group of pins coupled with the signal pins of the corresponding second connector 64 and the signal pins of the fourth connector 66 via trace patterns of the mid-plane circuit board 6. Consequently, the signal communications among the power supply units 4, the battery backup units 5 and the power shelf controller 9 can be performed via the first connectors 63, the second connectors 64 and the fourth connector 66.

Figure 17A:
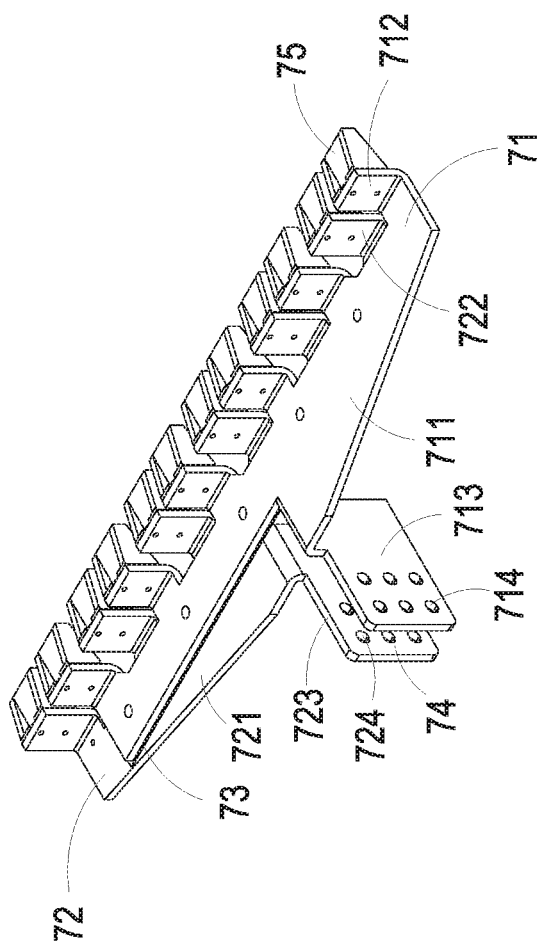
FIG. 17A is a schematic perspective view illustrating the bus bar assembly of the power distribution shelf of FIG. 12A.
Figure 17B:
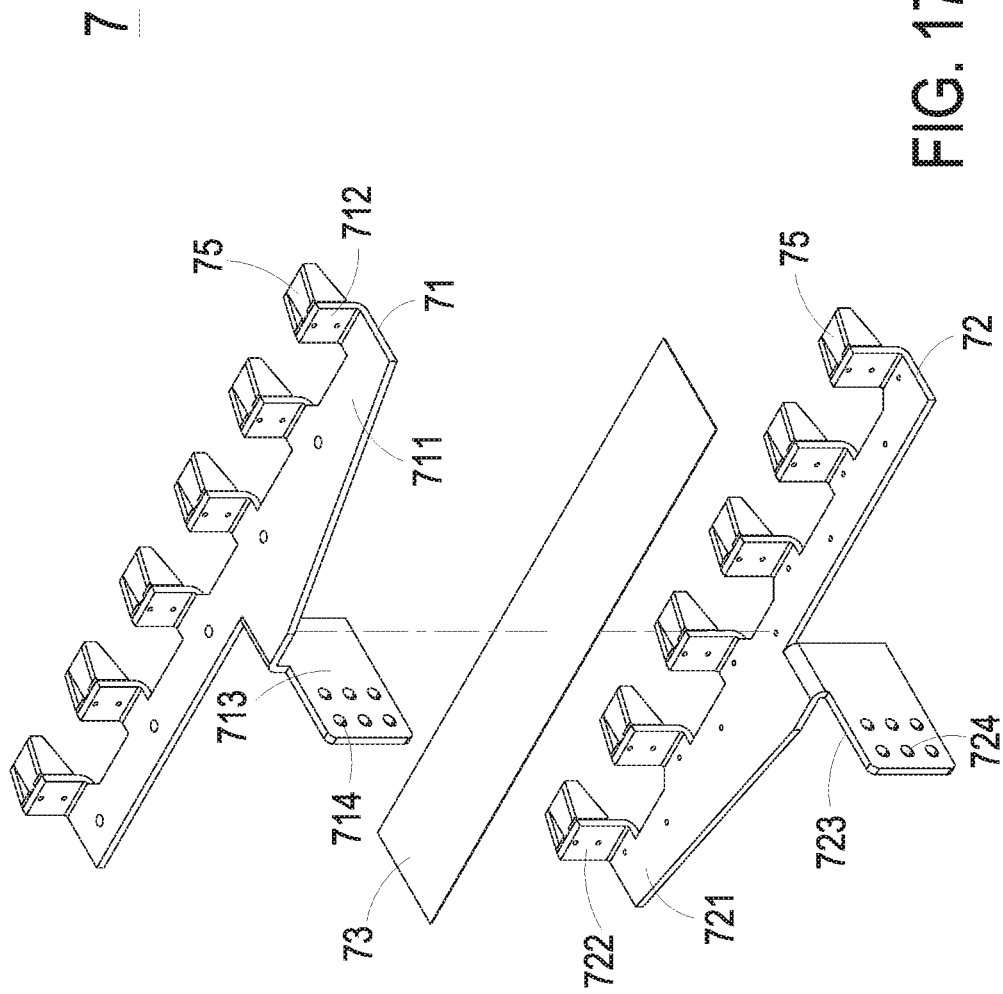
FIG. 17B is an explored view showing the bus bar assembly of FIG. 17A.
Figure 17D:
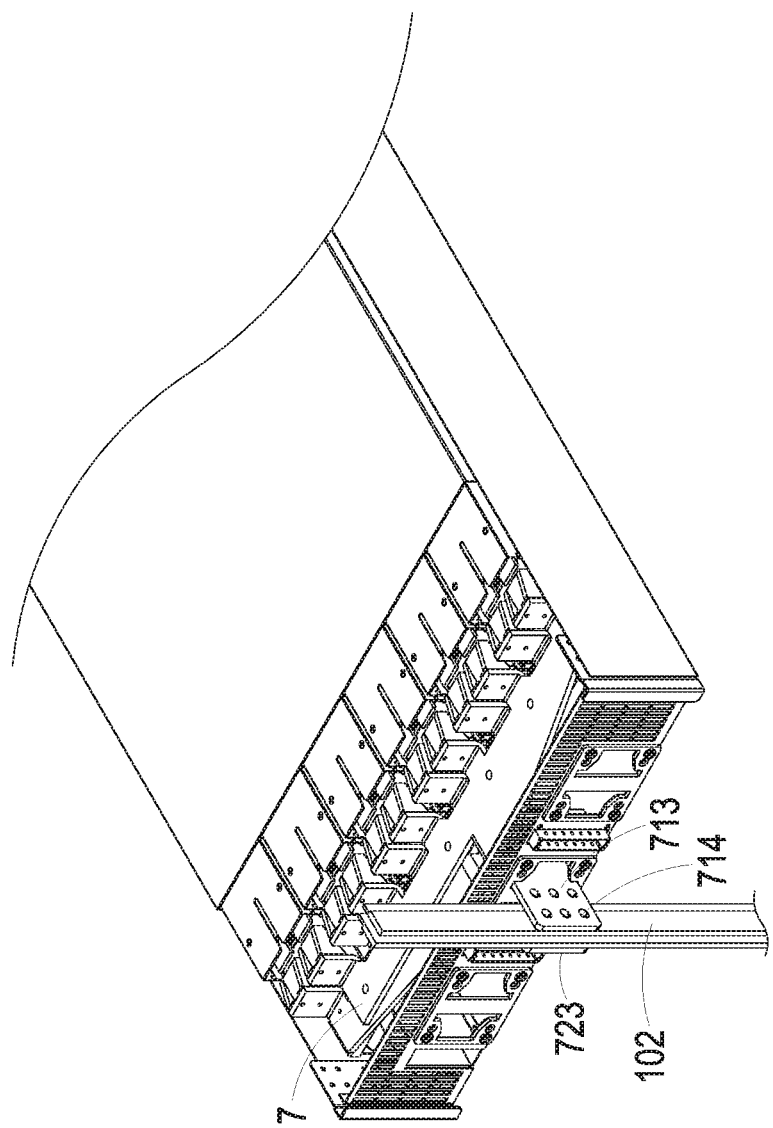
FIG. 17D is a schematic view showing the connections among the power supply units, the bus bar assembly and the rack bus bar.

FIG. 17A is a schematic perspective view illustrating the bus bar assembly of the power distribution shelf of FIG. 12A, FIG. 17B is an explored view showing the bus bar assembly of FIG. 17A, FIG. 17C is a schematic view showing the bus bar assembly fastened within the chassis, and FIG. 17D is a schematic view showing the connections among the power supply units, the bus bar assembly and the rack bus bar. As shown in FIGS. 17A, 17B, 17C and 17D, the bus bar assembly 7 includes a first linking bus bar 71 and a second linking bus bar 72. The first linking bus bar 71 and the second linking bus bar 72 are insulated with each other by an insulation member 73. The first linking bus bar 71 includes a first main bar 711, a plurality of first bending parts 712 and a first output part 713. The first bending parts 712 are connected with a first edge of the first main bar 711, and the first output part 713 is connected with a second edge of the first main bar 711, where the first edge is opposite to the second edge. The first bending parts 712 are arranged in a line, separated apart with each other at a specific interval and vertical to the first main bar 711. The second linking bus bar 72 includes a second main bar 721, a plurality of second bending parts 722 and a second output part 723. The second bending parts 722 are connected with a first edge of the second main bar 721, and the second output part 723 is connected with a second edge of the second main bar 721, where the first edge is opposite to the second edge. The second bending parts 722 are arranged in a line, separated apart with each other at a specific interval and vertical to the second main bar 721.

The first main bar 711 is disposed over the second main bar 721 and insulated with each other by the insulation member 73. The insulation member 73 is for example but not limited to an insulation gasket. The first bending parts 712 and the second bending parts 722 are staggered and arranged at the same plane. Namely, a first bending part 712 is disposed between any two neighboring second bending parts 722, and a second bending part 722 is disposed between any two neighboring first bending parts 712. The first output part 713 is vertical to the first main bar 711, and the second output part 723 is vertical to the second main bar 721. The first output part 713 and the second output part 723 are separated apart with each other at a specific interval and form a gap 74 therebetween. The gap 74 of the bus bar assembly 7 is configured to clip the rack bus bar 102 of the server rack 1. Namely, two vertical bus members of the rack bus bar 102 is in contact with the first output part 713 and the second output part 723 of the bus bar assembly 7 respectively. A plurality of clip-type power connectors 75 are mounted on and in contact with the first bending parts 712 and the second bending parts 722 respectively and correspondingly. The clip-type power connectors 75 are arranged on the same plane and aligned and mating with the power output electrodes of the power supply units 4 respectively and correspondingly.

Each of the power supply units 4 has a first power output electrode 42 and a second power output electrode 43 (see FIG. 15). The first power output electrode 42 is clipped by and in contact with a corresponding clip-type power connector 75 of the corresponding first bending part 712, and the second power output electrode 43 is clipped by and in contact with a corresponding clip-type power connector 75 of the corresponding second bending part 722. The clip-type power connector is securely mounted on and electrically connected with the corresponding first bending part 712, or is securely mounted on and electrically connected with the corresponding second bending part 722. Consequently, the DC output power outputted by the power supply unit 4 via the first power output electrode 42 and the second power output electrode 43 can be transferred to the rack bus bar 102 through the first output part 713 of the first linking bus bar 71 and second output part 723 of the second linking bus bar 72. In an embodiment, the first output part 713 of the first linking bus bar 71 further includes a plurality of first holes 714, and the second output part 723 of the second linking bus bar 72 further includes a plurality of second holes 724. The first holes 714 are corresponding to the second holes 724 respectively. As shown in FIG. 17D, the first holes 714 and the second holes 724 are configured to allow the rack bus bar 102 of the server rack 1 to be securely mounted in the gap 74 between the first output part 713 and the second output part 723. The first hole 714 and the second hole 724 are for example but not limited to the screw holes for screwing.

In an embodiment, the first linking bus bar 71 has six first bending parts 712 and six clip-type power connectors 75 corresponding to and aligned with the six first power output electrodes 42 of the six power supply units 4 respectively. The second linking bus bar 72 has six second bending parts 722 and six clip-type power connectors 75 corresponding to and aligned with the six second power output electrodes 43 of the six power supply units 4 respectively. Preferably but not exclusively, the first linking bus bar 71 and the second linking bus bar 72 are copper plates. In an embodiment, the second linking bus bar 72 is grounded. In an embodiment, the bus bar assembly 7 is fastened within the chassis 3 via the first bracket 36, but it is not limited thereto. In an embodiment, the clip-type power connector 75 is floating and mounted on the first bending part 712 or the second bending part 722. Consequently, the power output electrodes (42, 43) of the power supply units 4 can be blind inserted into the clip-type power connectors 75 of the bus bar assembly 7.

Please refer to FIG. 17C. In this embodiment, two AC input power connectors 8 are fastened on the bottom plate of the chassis 3 and close to an edge of the bottom plate. The two AC input power connectors 8 include a first AC input power connector 8a and a second AC input power connector 8b. The first AC input power connector 8a is electrically connected with a three-phase AC power source, and the second AC input power connector 8b is electrically connected with a single-phase AC power source, but they are not limited thereto. The two AC input power connectors 8 include a plurality of pins respectively. The pins can be for example but not limited to seven pins, six of them are configured as power pins, and the other one is configured as a ground pin. Each of the AC input power connectors 8 are electrically connected with each one of the third connectors 65 via plural power cable 81. Namely, each of the six third connectors 65 is electrically connected with the first AC input power connector 8a via power cables 81 and electrically connected with the second AC input power 8b via the power cables 81. Consequently, the AC input power from the two AC power sources can be transferred to the power supply units 4 via the AC input power connectors 8, the third connectors 65 and the first connectors 63, and switch between the two AC power sources. In an embodiment, the two AC input power connectors 8 are electrically connected with two three-phase AC power sources respectively, or are electrically connected with the single-phase AC power sources respectively, but not exclusively.

Figure 18:
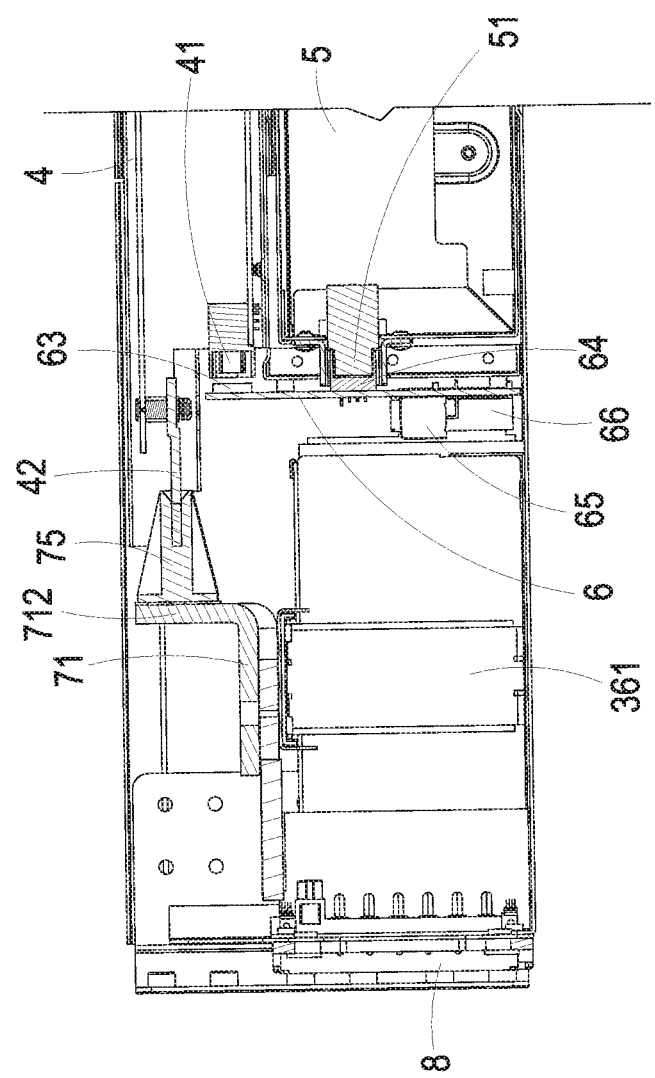
FIG. 18 is a cross-sectional view showing the electrical and mechanical connections among the power supply unit, the battery backup unit, the mid-plane circuit board and the bus bar assembly.

FIG. 18 is a cross-sectional view showing the electrical and mechanical connections among the power supply unit, the battery backup unit, the mid-plane circuit board and the bus bar assembly. As shown in FIG. 18, the power output electrode 42 of the power supply unit 4 is inserted into and connected with the clip-type power connector 75 of the bus bar assembly 7. The first connection interface 41 of the power supply unit 4 is connected with the first connector 63 of the mid-plane circuit board 6. The second connection interface 51 of the battery backup unit 5 is connected with the second connector 64 of the mid-plane circuit board 6. The AC input power connector 8 is configured to receive the AC power. As shown in FIGS. 9A and 10A, the AC input power connector 8 is connected with the AC power adapter 1 or the AC power adapter 2 so as to receive the AC power. Each of the AC input power connectors 8 is electrically connected with each one of the third connector 65 of the mid-plane circuit board 6. Consequently, the electrical and mechanical connecting structures among the power supply units 4, the battery backup units 5, the power shelf controller 9 and the two AC power sources are simplified via the mid-plane circuit board 6. In addition, the bus bar assembly 7 is employed in the power distribution shelf 103 to transfer the DC output power from the power supply units 4 to the rack bus bar 102. Consequently, the purposes of further miniaturization of the power distribution shelf 103 and improvement in energy efficiency are achieved. Moreover, the cost is reduced and the reliability is enhanced.

In this embodiment, the power distribution shelf 103 receives the AC input power from two AC power sources. In addition, each power supply unit 4 has an integrated automatic transfer switch capable of switching the AC input power from the two AC power sources according to the status. Each power supply unit 4 has a dedicated battery backup unit 5 that can provide backup power to the server within the rack server 1 during the AC input power from the two AC power sources is outage. Moreover, each pair of the power supply unit 4 and the battery backup unit 5 can perform current sharing functions between each other, and the power supply unit 4 has a charging/discharging circuit, so that the power supply unit 4 can charge the battery backup unit 5 and the battery backup unit 5 can discharge to the power supply unit 4. Furthermore, the power distribution shelf 103 can report the status of individual pair of the power supply unit 4 and the battery backup unit 5 over for example but not limited to PMbus (Power Management Bus) when the AC input power drops or is failure. The power shelf controller 9 can communicate with the power supply units 4 and the battery backup units 5 and monitor and control the operations of the individual pair of the power supply unit 4 and the battery backup unit 5.

Figure 19B:
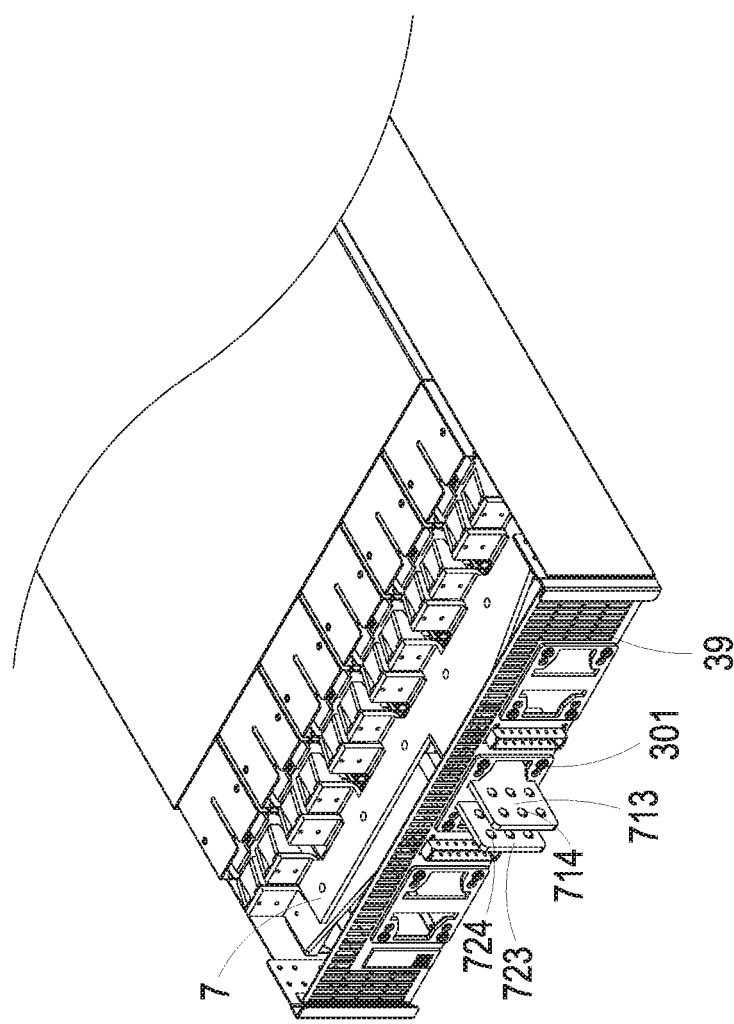
FIG. 19B is a schematic view showing the location of the output parts located at the rear plate of the chassis.

FIG. 19A is a schematic perspective view illustrating the relationships between the output parts of the bus bar assembly and the rear plate of the chassis, and FIG. 19B is a schematic view showing the location of the output parts located at the rear plate of the chassis. As shown in FIGS. 19A and 19B, the chassis 3 includes the rear plate 39 having three openings 301. The first output part 713 and the second output part 723 of the bus bar assembly 7 are extending outwardly from a middle one of the three openings 301. Namely, the first output part 713 and the second output part 723 of the bus bar assembly 7 are protruded out from the rear plate 39 of the chassis 3. In an embodiment, the first output part 713 and the second output part 723 of the bus bar assembly 7 are extending outwardly from the other one of the three openings 301. In an embodiment, the bus bar assembly 7 includes two pairs of the first output parts 713 and the second output parts 723, and the two pairs of the first output parts 713 and the second output parts 723 are extending outwardly from any two of the three openings 301 (not shown).

Figure 20:
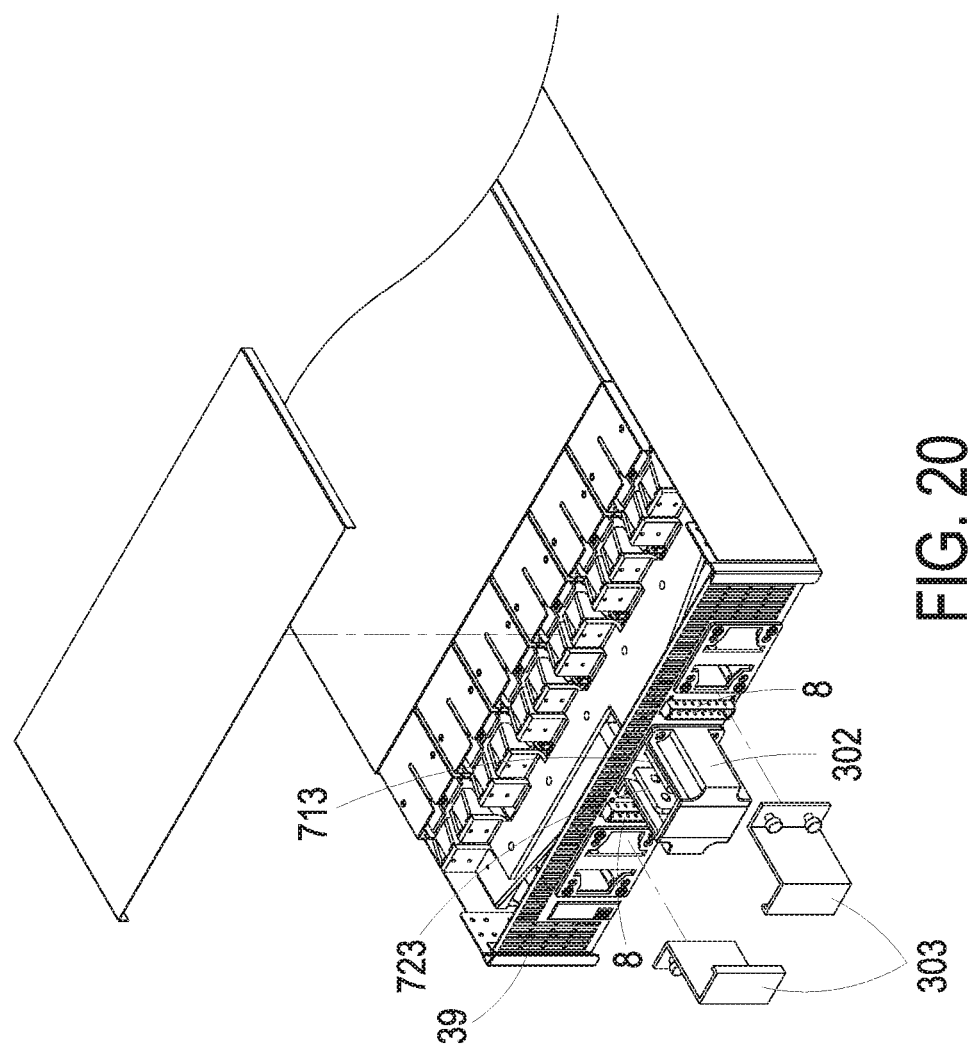
FIG. 20 is a schematic perspective view illustrating another example of the power distribution shelf of FIG. 12A.

FIG. 20 is a schematic perspective view illustrating another example of the power distribution shelf of FIG. 12A. As shown in FIG. 20, in an embodiment, the chassis 3 further includes a first protection bracket 302 and two second protection brackets 303. The first protection bracket 302 can be fastened on the rear plate 39 and cover the first output part 713 and the second output part 723. Consequently, the connections between the rack bus bar 102 and the first output part 713 and the second output part 723 of the bus bar assembly 7 can be protected. The two second protection brackets 303 can be fastened on the rear plate 39 and aligned with the two AC input power connectors 8 respectively and correspondingly. When the AC input power connector 8 is plugged with a corresponding external AC power cable, as shown in FIGS. 9A and 10A, the second protection bracket 303 protects the plug 15 of the AC power adapter (1, 2). Meanwhile, the plug 15 is prevented or limited from moving away from the AC input power connector 8, and thus the plug 15 can't be drawn out. Consequently, the AC input power connectors 8 and the plug 15 of the AC power adapter (1, 2) are protected.

In an embodiment, as shown in FIGS. 15, 16A and 18, the second connection interfaces 51 of the battery backup units 5 are floated. Consequently, the second connection interfaces 51 of the battery backup units 5 can be blind inserted in the second connectors 64 of the mid-plane circuit board 6 to ensure the connections between the battery backup units 5 and the mid-plane circuit board 6.

In an embodiment, as shown in FIGS. 15, 16A and 18, the rear plates of the power supply units 4 are omitted. After the first connection interfaces 41 of the power supply units 4 are connected with the first connectors 63 of the mid-plane circuit board 6 respectively, the cooling airflow provided by the fans (not shown) within the power supply units 4 can be introduced to the bus bar assembly 7 directly. Consequently, the heat can be transferred to the surrounding, and the heat-dissipation effect is enhanced without adding any fan within the chassis 3.

From the above descriptions, the power distribution shelf 103 is connected with the AC power adapter (1, 2), whose amount is corresponding to the amount of the AC input power connector 8. The power distribution shelf 103 selectively receives the AC input power and provides to the server rack 101. Regardless of whether the power source provides the three-phase AC power or the single-phase AC power, the user only need to correspondingly replace the AC power adapter (1, 2) rather than the AC input power connector 8.

In conclusion, the present disclosure provides an AC power adapter and a power distribution system employing the same. The AC power adapter receives and adapts a three-phase AC power or three single-phase AC powers to three single-phase AC powers sharing ground wire. Three single-phase AC powers sharing ground wire are provided by an electrical connector of a plug of the AC power adapter. Therefore, the power distribution shelf, which is connected with the AC power adapter, is selectively powered by the three-phase AC power or the single-phase AC power according to the practical requirements. Thus the applicability of the AC power adapter is enhanced. In addition, it is unnecessary to design a corresponding connector for the power distribution shelf in accordance with different input power, which decreases the fabricating cost and maintenance cost. Moreover, by the AC power adapter of the power distribution system, a multiple input power distribution shelf of the power distribution system selectively receives the single-phase AC power or the three-phase AC power according to the practical requirements. It is unnecessary to design a corresponding AC input power connector in accordance with different input power, which decreases the fabricating cost and maintenance cost.

While the disclosure has been described in terms of what is presently considered to be the most practical and preferred embodiments, it is to be understood that the disclosure needs not be limited to the disclosed embodiment.

What is claimed is:

1. An AC power adapter comprising:
   plural input connectors, wherein each of the plural input connectors receives a single-phase AC power;
   plural first power conveying wires connected with the plural input connectors one-to-one, wherein each of the plural first power conveying wires comprises an input neutral wire, an input live wire and an input ground wire, and the input neutral wire, the input live wire and the input ground wire are insulated from each other;
   a junction box comprising a first accommodation space, wherein each of the plural first power conveying wires is at least partially inserted into the first accommodation space;
   a power conveying wire assembly at least partially inserted into the first accommodation space and comprising plural output neutral wires, plural output live wires and an output ground wire, wherein the plural output neutral wires, the plural output live wires and the output ground wire are insulated from each other, wherein in the first accommodation space, the plural output neutral wires are connected with the plural input neutral wires of the plural first power conveying wires one-to-one, the plural output live wires are connected with the plural input live wires of the plural first power conveying wires one-to-one, and the output ground wire is connected with the plural input ground wires of the plural first power conveying wires; and
   a plug comprising a housing and an electrical connector, wherein the electrical connector is engaged or embedded in the housing, and the power conveying wire assembly is at least partially inserted into the housing and is electrically connected with the electrical connector,
   wherein the junction box further comprises a separating base, plural separating plates and a cover plate, the separating base, the plural separating plates and the cover plate are disposed within the first accommodation space, the plural separating plates are mounted on the separating base and form plural wiring channels, so that the plural output neutral wires, the plural output live wires and the output ground wire of the power conveying wire assembly are accommodated in the plural wiring channels respectively, and the cover plate is mounted relative to the plural separating plates.

2. The AC power adapter according to claim 1, wherein the plural input connectors comprise three input connectors, the plural first power conveying wires comprise three first power conveying wires, the three first power conveying wires are connected with the three input connectors one-to-one, each of the three first power conveying wires is at least partially inserted into the first accommodation space, the plural output neutral wires of the power conveying wire assembly comprise three output neutral wires, the plural output live wires of the power conveying wire assembly comprise three output live wires, wherein in the first accommodation space, the three output neutral wires are connected with the three input neutral wires of the three first power conveying wires respectively, the three output live wires are connected with the three input live wires of the three first power conveying wires respectively, and the output ground wire is connected with the three input ground wires of the three first power conveying wires.

3. The AC power adapter according to claim 2, wherein among the three first power conveying wires, the input neutral wire and the input live wire of one of the three first power conveying wires are a first input neutral wire and a first input live wire respectively, the input neutral wire and the input live wire of another first power conveying wire are a second input neutral wire and a second input live wire respectively, and the input neutral wire and the input live wire of the other first power conveying wire are a third input neutral wire and a third input live wire respectively.

4. The AC power adapter according to claim 3, wherein the three output neutral wires of the power conveying wire assembly are a first output neutral wire, a second output neutral wire and a third output neutral wire respectively, the three output live wires of the power conveying wire assembly are a first output live wire, a second output live wire and a third output live wire respectively, and the first output neutral wire, the second output neutral wire, the third output neutral wire, the first output live wire, the second output live wire and the third output live wire are connected with the first input neutral wire, the second input neutral wire, the third input neutral wire, the first input live wire, the second input live wire and the third input live wire respectively.

5. The AC power adapter according to claim 4, wherein the electrical connector comprises seven pins, the seven pins are separated and insulated from each other and are arranged in a line, and the seven pins are electrically connected with the output ground wire, the first output live wire, the first output neutral wire, the second output live wire, the second output neutral wire, the third output live wire and the third output neutral wire respectively.

6. The AC power adapter according to claim 4, wherein the power conveying wire assembly comprises a second power conveying wire and a third power conveying wire, the second power conveying wire comprises the output ground wire, the first output live wire and the first output neutral wire, and the third power conveying wire comprises the second output live wire, the second output neutral wire, the third output live wire and the third output neutral wire.

7. The AC power adapter according to claim 6, wherein the power conveying wire assembly further comprises an adhesive tape, and the adhesive tape wraps and retains the second power conveying wire and the third power conveying wire.

8. The AC power adapter according to claim 2, wherein the junction box further comprises an input end part and an output end part, the input end part has three apertures, the output end part has an aperture, the three apertures of the input end part and the aperture of the output end part are in communication with the first accommodation space separately, the three first power conveying wires are at least partially inserted into the first accommodation space through the three apertures of the input end part respectively, and the power conveying wire assembly is at least partially inserted into the first accommodation space through the aperture of the output end part.

9. The AC power adapter according to claim 8, wherein the housing of the plug comprises a first end part, a second end part and a second accommodation space, the first end part has an aperture, the second end part has an aperture, the aperture of the first end part and the aperture of the second end part are in communication with the second accommodation space separately, the electrical connector is engaged or embedded in the aperture of the first end part, the electrical connector is partially located in the second accommodation space and partially exposed from the first end part, and the power conveying wire assembly is at least partially inserted into the second accommodation space through the aperture of the second end part.

10. The AC power adapter according to claim 9, wherein the AC power adapter comprises plural insulating members, the plural insulating members are mounted on the input end part and the output end part of the junction box and the second end part of the housing of the plug respectively, and the plural insulating members wrap part of the first power conveying wire and part of the power conveying wire assembly.

11. The AC power adapter according to claim 8, wherein the junction box comprises a first casing component and a second casing component, and the first casing component is assembled with the second casing component so as to form the first accommodation space.

12. The AC power adapter according to claim 2, wherein each of the input connectors comprises three conducting pins, the three conducting pins are connected with the input neutral wire, the input live wire and the input ground wire of the corresponding first power conveying wire respectively.

* * * * *